(12) United States Patent
Kim et al.

(10) Patent No.: US 11,140,790 B2
(45) Date of Patent: Oct. 5, 2021

(54) DISPLAY DEVICE

(71) Applicant: Samsung Display Co., Ltd., Yongin-Si (KR)

(72) Inventors: Taewoong Kim, Seongnam-si (KR); Hyunwoo Koo, Hwaseong-si (KR); Hyungsik Kim, Suwon-si (KR); Jeongho Kim, Suwon-si (KR); Jinhwan Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/382,811

(22) Filed: Apr. 12, 2019

(65) Prior Publication Data
US 2020/0060028 A1 Feb. 20, 2020

(30) Foreign Application Priority Data

Aug. 20, 2018 (KR) .......................... 10-2018-0096976

(51) Int. Cl.
H05K 5/00 (2006.01)
H05K 5/02 (2006.01)
H05K 5/03 (2006.01)
H01L 51/52 (2006.01)
(Continued)

(52) U.S. Cl.
CPC ....... H05K 5/0017 (2013.01); H01L 51/5237 (2013.01); H04B 1/3877 (2013.01); H05K 5/0217 (2013.01); H05K 5/03 (2013.01); H01L 27/3244 (2013.01); H01L 2251/5338 (2013.01)

(58) Field of Classification Search
None
See application file for complete search history.

(56) References Cited

U.S. PATENT DOCUMENTS 9,007,350 B2  4/2015  Burgin et al.
9,756,757 B2  9/2017  Park et al.
9,940,892 B2  4/2018  Pang
           (Continued)

FOREIGN PATENT DOCUMENTS

EP  2557556 A2   2/2013
EP  3107082 A1  12/2016
           (Continued)

OTHER PUBLICATIONS

Partial European Search Report for Application No. 19191886.1-1216 dated Jan. 21, 2020.

Primary Examiner — Abhishek M Rathod
(74) Attorney, Agent, or Firm — Cantor Colburn LLP

(57) ABSTRACT

A display device includes a first guide member extending in a first direction, a second guide member extending in the first direction and facing the first guide member in a second direction crossing the first direction, a display panel disposed between the first guide member and the second guide member, a support member which supports a portion of the display panel, a first driving unit which moves the support member, and a second driving unit connected to one end of the display panel to roll or unroll the display panel. Both sides of the support member are inserted into guide grooves defined in an inner side surface of the first guide member and an inner side surface of the second guide member, which faces the inner side surface of the first guide member, and the support member moves along the guide grooves.

30 Claims, 27 Drawing Sheets

(51) Int. Cl.
*H04B 1/3877* (2015.01)
*H01L 27/32* (2006.01)

(56) References Cited

U.S. PATENT DOCUMENTS

| | | |
|---|---|---|
| 2011/0080694 A1 | 4/2011 | Kao |
| 2013/0033844 A1 | 2/2013 | Ladouceur et al. |
| 2013/0038584 A1* | 2/2013 | Burgin .............. G09F 9/30 345/205 |
| 2013/0058063 A1 | 3/2013 | O'Brien |
| 2016/0100478 A1 | 4/2016 | Lee |
| 2016/0143162 A1 | 5/2016 | Van Dijk et al. |
| 2016/0155965 A1* | 6/2016 | Kusuura .............. G06F 1/1652 361/749 |
| 2016/0161983 A1 | 6/2016 | Lee et al. |
| 2017/0013726 A1* | 1/2017 | Han ............... H05K 5/0217 |
| 2017/0031387 A1* | 2/2017 | Kim ............... G06F 1/1652 |
| 2017/0064847 A1 | 3/2017 | Lim |
| 2017/0358636 A1 | 12/2017 | Kim et al. |
| 2017/0359910 A1 | 12/2017 | Seo et al. |
| 2017/0367198 A1 | 12/2017 | Park et al. |
| 2018/0098440 A1* | 4/2018 | Choi ............... G06F 1/1652 |
| 2018/0110137 A1* | 4/2018 | Kim ............ G02F 1/133305 |

FOREIGN PATENT DOCUMENTS

| | | |
|---|---|---|
| EP | 3173897 A1 | 5/2017 |
| EP | 3203817 A1 | 8/2017 |
| KR | 1020150134262 A | 12/2015 |
| KR | 1020170139732 A | 12/2017 |
| KR | 1020170143112 A | 12/2017 |

* cited by examiner

FIG. 2
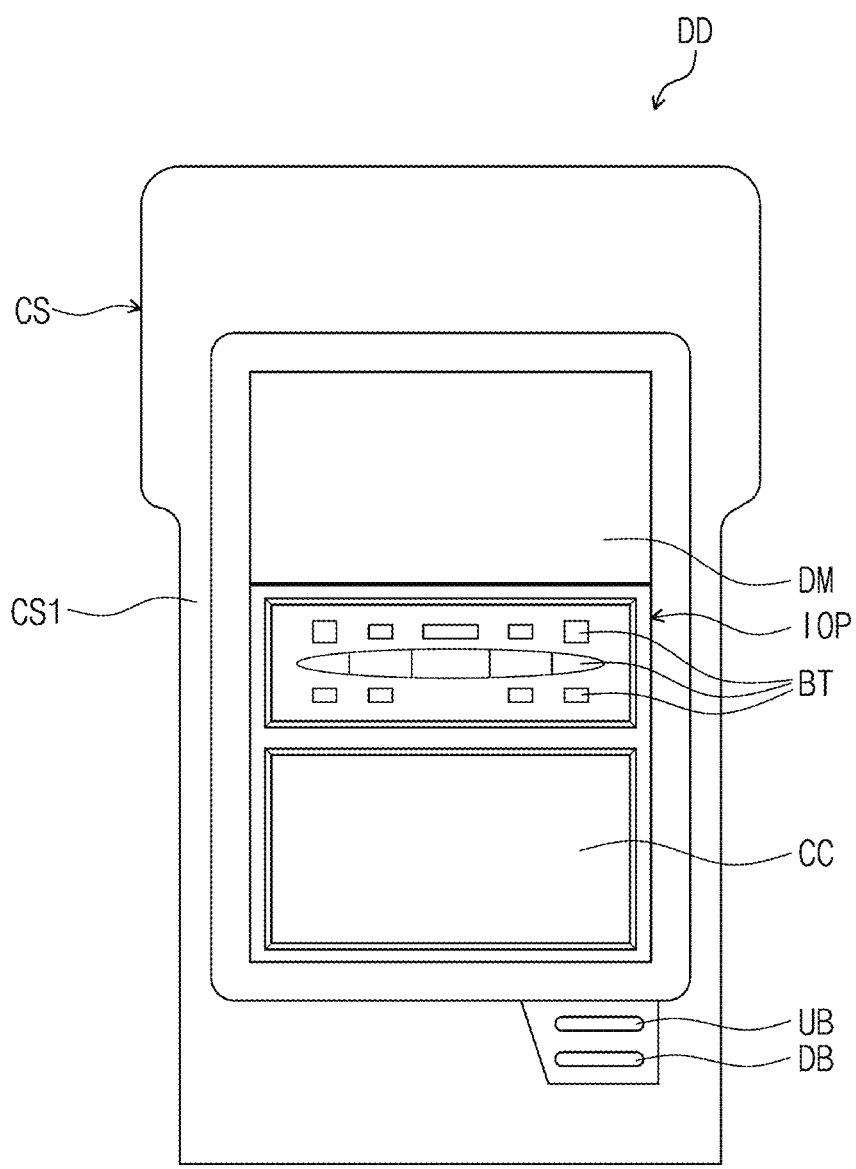
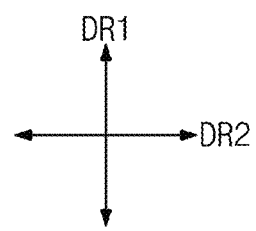

DISPLAY DEVICE

This application claims priority to Korean Patent Application No. 10-2018-0096976, filed on Aug. 20, 2018, and all the benefits accruing therefrom under 35 U.S.C. § 119, the content of which in its entirety is herein incorporated by reference.

BACKGROUND

1. Field

The disclosure relates to a display device.

2. Description of the Related Art

Electronic devices that display an image, such as a smart phone, a digital camera, a laptop computer, and a smart television, may include a display device to display the image. The display device generates the image and provides the image to the user through a display screen thereof.

In recent years, with the development of display device technology, various types of display devices including a flexible display device that is foldable or rollable have been developed. The flexible display device, which is capable of being varied in various shapes, is easy to carry and improves a user's convenience.

SUMMARY

A flexible display device may include a flexible display panel, which is rolled or unrolled. However, when the rolled flexible display panel is unrolled, the display panel may not be substantially flat. Accordingly, a technique that improves a flatness of the unrolled display panel is desired.

The disclosure provides a display device capable of improving a flatness of a display panel.

Embodiments of the invention provide a display device including a first guide member extending in a first direction, a second guide member extending in the first direction and facing the first guide member in a second direction crossing the first direction, a display panel disposed between the first guide member and the second guide member, a support member which supports a portion of the display panel, a first driving unit which moves the support member, and a second driving unit connected to one end of the display panel to roll or unroll the display panel. In such embodiment, both sides of the support member are inserted into guide grooves defined in an inner side surface of the first guide member and an inner side surface of the second guide member, which faces the inner side surface of the first guide member, and the support member moves along the guide grooves.

Embodiments of the invention provide a display device including a display panel, a support member disposed under the display panel, a first driving unit coupled to a predetermined portion of the support member to move the support member, a second driving unit connected to one end of the display panel to roll or unroll the display panel, a window disposed on an unrolled portion of the display panel and spaced apart from a rolled portion of the display panel, and a third driving unit connected to one end of the window spaced apart from the display panel to roll a portion of the window, which is spaced apart from the display panel. In such embodiments, the support member supports an unrolled portion of the display panel, the second driving unit is disposed between the first driving unit and the third driving unit, and the first, second, and third driving units rotate in a same direction as each other.

Embodiments of the invention provide a display device including a first guide member, a second guide member facing the first guide member, a display panel disposed between the first guide member and the second guide member, a plurality of joint units which supports a portion of the display panel and is coupled to each other to rotate, a first driving unit moving the joint units, and a second driving unit connected to one end of the display panel to roll or unroll the display panel. In such embodiments, both sides of the joint units are inserted into guide grooves defined in an inner side surface of the first guide member and an inner side surface of the second guide member, which faces the inner side surface of the first guide member, and the joint units move along the guide grooves.

According to embodiments described herein, the display device includes the support member that supports the display panel disposed between the first guide member and the second guide member, and the support member moves along the guide grooves defined in the first and second guide members. In such embodiment, the support member supported by the guide grooves may support the display panel, which is unrolled to enlarge the exposed area, to be substantially flat.

BRIEF DESCRIPTION OF THE DRAWINGS

The above and other features of embodiments of the disclosure will become readily apparent by reference to the following detailed description when considered in conjunction with the accompanying drawings, in which:

FIGS. 2, 3, and 4 are front views of the display device shown in FIG. 1 when viewed in front to show various states of an exposed area of a display module shown in FIG. 1;

DETAILED DESCRIPTION

Figure 1:
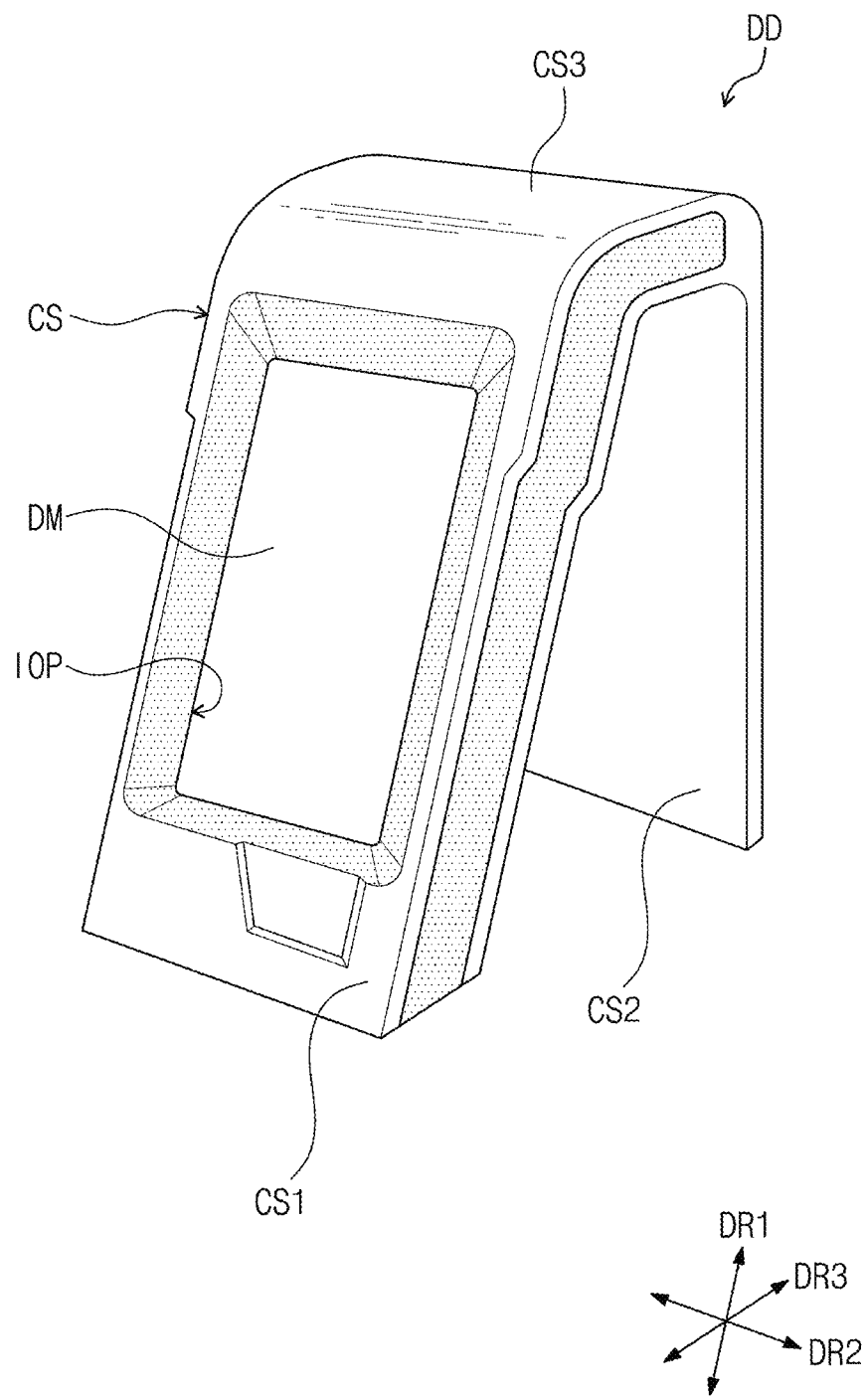
FIG. 1 is a perspective view showing a display device according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on" "directly connected to" or "directly coupled to" another element or layer, there are no intervening elements present.

"Or" means "and/or." "At least one of A and B" means "A and/or B." As used herein, the term "and/or" includes any and all combinations of one or more of the associated listed items.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein. As used herein, the singular forms, "a", "an" and "the" are intended to include the plural forms, including "at least one," unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," or "includes" and/or "including", when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

FIG. 1 is a perspective view showing a display device DD according to an exemplary embodiment of the disclosure.

Referring to FIG. 1, an exemplary embodiment of the display device DD includes a display module DM and a case CS accommodating the display module DM therein. The display module DM may be exposed to an outside through an image opening portion TOP defined through the case CS.

The display module DM may be, but not limited to, a flexible display module. The exposed area of the display module DM may be changed in various ways. The configuration of the display module DM will be described later in greater detail with reference to FIGS. 2 to 4. The display module DM may provide a predetermined image to a user through the image opening portion IOP.

The case CS may include a first case CS1, a second case CS2, and a third case CS3. The display module DM is accommodated in the first case CS1 and is exposed to the outside through the image opening portion IOP defined through the first case CS1.

The first case CS1 may have a rectangular shape with long sides in a first direction DR1 and short sides in a second direction DR2 crossing the first direction DR1. The first case CS1 may have a plane surface defined by the first and second directions DR1 and DR2. The second case CS2 may be disposed to face the first case CS1. The third case CS3 may extend from an upper end of the first case CS1 to an upper end of the second case CS2.

The display device DD may be applied to various image display devices, e.g., a car, an aircraft, or a ship as a navigation unit. When the display device DD is applied to the car, the aircraft, or the ship as the navigation unit, the second and third cases CS2 and CS3 may be embedded in interiors of the car, the aircraft, or the ship.

Hereinafter, a direction substantially vertical to the plane surface defined by the first and second directions DR1 and DR2 will be referred to as a "third direction" DR3.

Figure 3:
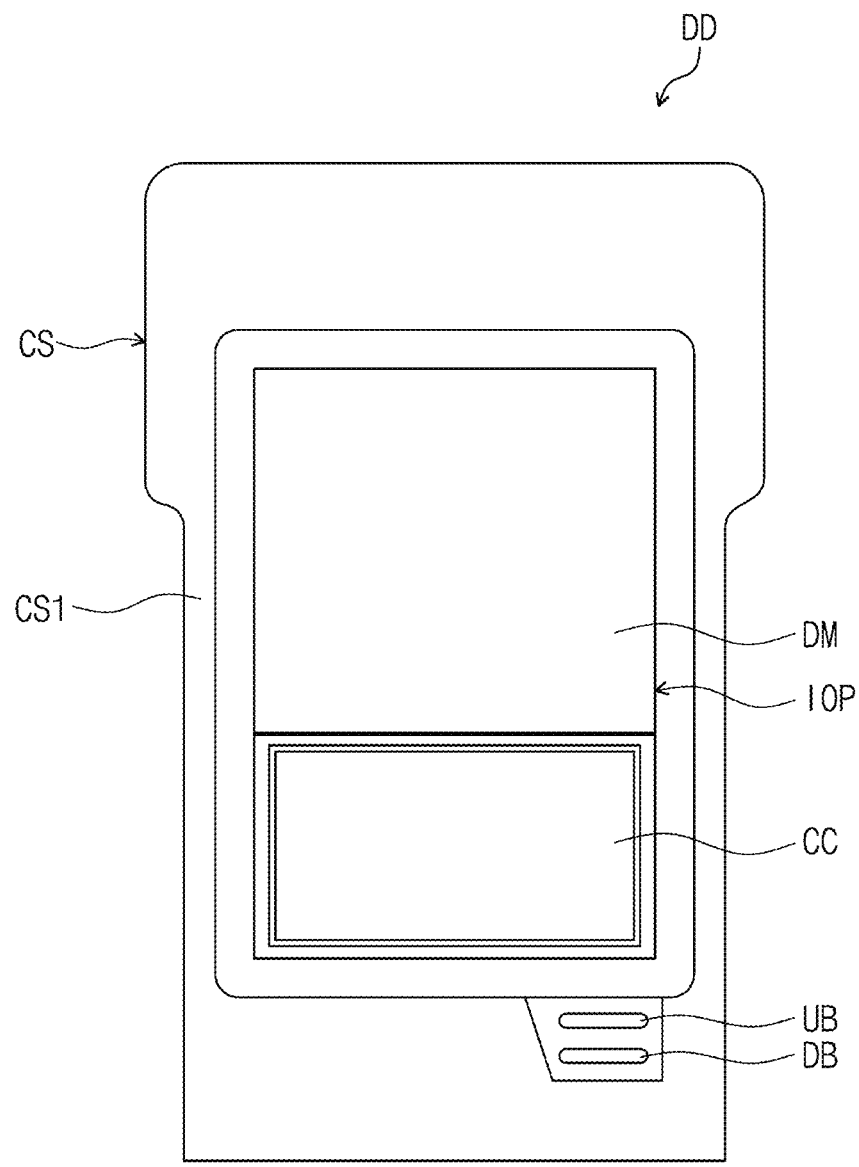
Figure 4:
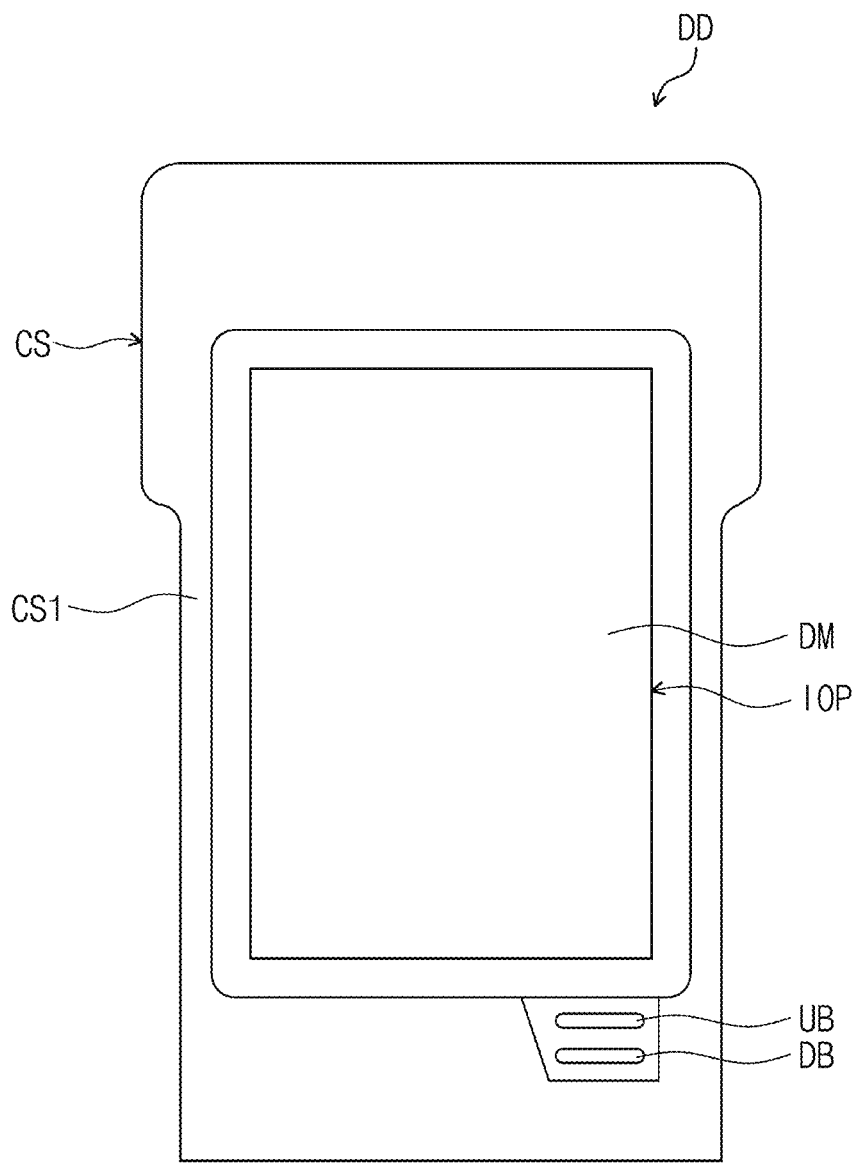

FIGS. 2, 3, and 4 are front views of the display device shown in FIG. 1 when viewed in front to show various states of the exposed area of a display module shown in FIG. 1.

Referring to FIGS. 2, 3, and 4, the area of the display module DM exposed through the image opening portion IOP may be changed. In one exemplary embodiment, for example, the display module DM may be disposed at a position corresponding to ⅓ of the image opening portion IOP as shown in FIG. 2. In such an embodiment, the display module DM may be disposed at a position corresponding to ⅔ of the image opening portion IOP as shown in FIG. 3 or may be disposed over the entire image opening portion IOP as shown in FIG. 4.

The exposed area of the display module DM may be varied by an up button UB and a down button DB, which may be disposed at a lower portion of the first case CS1. In one exemplary embodiment, for example, when the user operates the up button UB, the exposed area of the display module DM may be reduced from a state shown in FIG. 4 to a state shown in FIG. 3 or from the state shown in FIG. 3 to a state shown in FIG. 2. In such an embodiment, when the user operates the down button DB, the exposed area of the display module DM may be enlarged from the state shown in FIG. 2 to the state shown in FIG. 3 or from the state shown in FIG. 3 to the state shown in FIG. 4.

In an exemplary embodiment, as described above, the display module DM may be disposed at the position corresponding to ⅓ of the image opening portion IOP in a default normal mode as shown in FIG. 2, and the exposed area of the display module DM may be varied by the up button UB and the down button DB. In such an embodiment, a predetermined portion of the display module may be exposed through a portion corresponding to ⅓ of the image opening portion IOP at all times, but not being limited thereby or thereto. Alternatively, the display module DM may not be exposed through the image opening portion IOP as a default and may be exposed to the outside by operating the down button DB.

In an exemplary embodiment, a plurality of functional buttons BT and a cell phone cradle CC may be defined in the image opening portion IOP of the first case CS1. In one exemplary embodiment, for example, in a case where the display device DD is applied to the car, the functional buttons BT may be functional buttons that operate a car's internal temperature, an air conditioner, and an audio equipment. The cell cradle CC may be defined or formed in a recessed groove to mount the cell phone.

The functional buttons BT and the cell phone cradle CC may be exposed to the outside or covered by the display module DM depending on the exposed area of the display module DM. In an exemplary embodiment, when the display module DM is exposed as shown in FIG. 2, the functional buttons BT and the cell phone cradle CC may be exposed to the outside.

In the case where the display module DM is exposed as shown in FIG. 3, the functional buttons BT may be covered by the display module DM, and the cell phone cradle CC may be exposed to the outside. In the case where the display module DM is exposed as shown in FIG. 4, the functional buttons BT and the cell phone cradle CC may be covered by the display module DM and may not be exposed to the outside.

Figure 5:
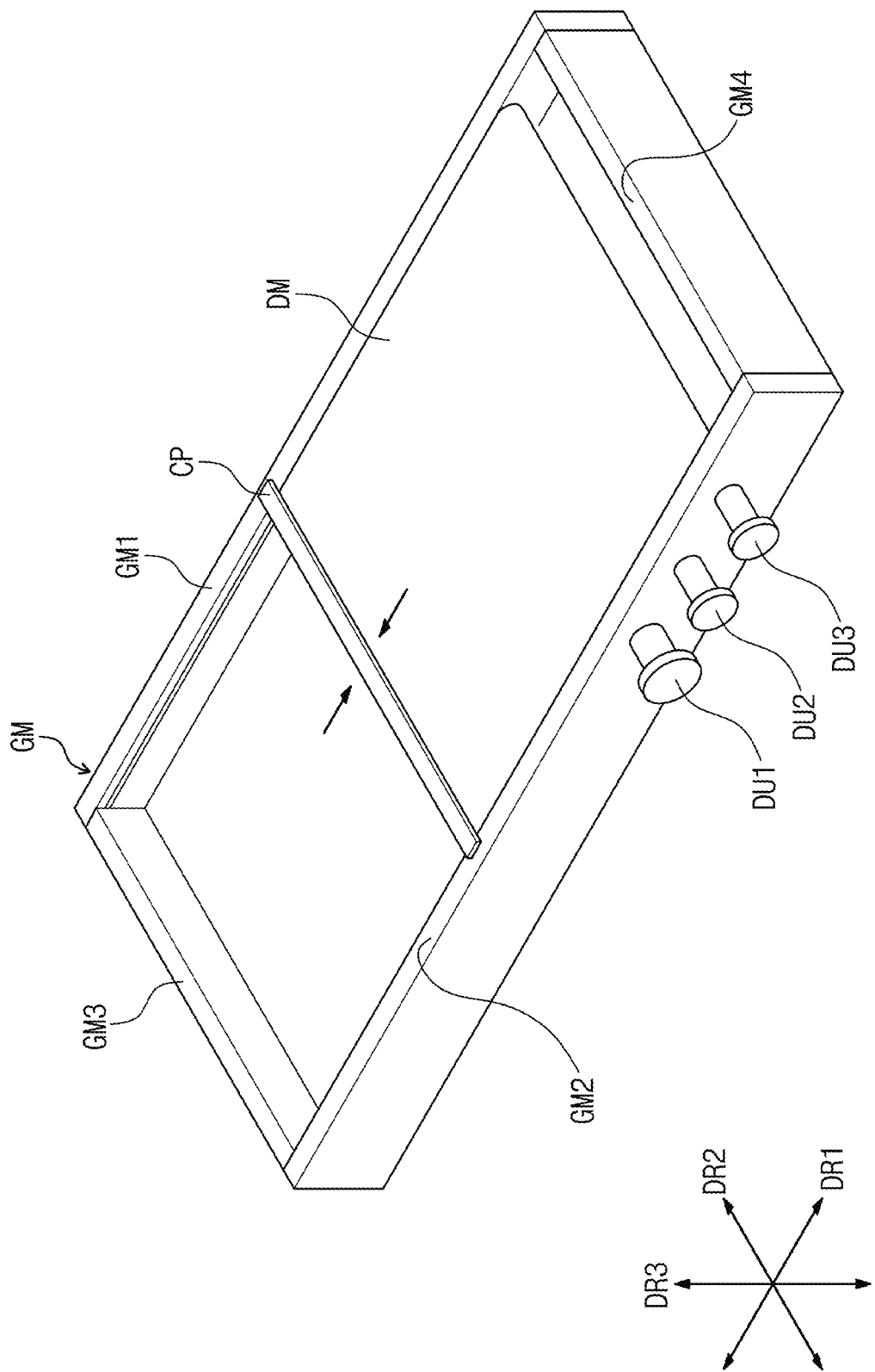
FIG. 5 is a view showing an exemplary embodiment of a display module and a guide member, which are accommodated in a case shown in FIG. 1.

FIG. 5 is a view showing an exemplary embodiment of a display module and a guide member, which are accommodated in the case shown in FIG. 1.

Referring to FIG. 5, in an exemplary embodiment, the guide member GM may have a rectangular frame shape. In an exemplary embodiment, the display device DD may include a support member (shown in FIGS. 13 and 14) disposed under the display module DM to support a portion of the display module DM. The guide member GM may function as an accommodation member to accommodate the display module DM and the support member.

The guide member GM may include a first guide member GM1 extending in the first direction DR1, a second guide member GM2 extending in the first direction DR1, a third guide member GM3 extending in the second direction DR2, and a fourth guide member GM4 extending in the second direction DR2. For the convenience of description and illustration, the functional buttons BT and the cell phone cradle CC shown in FIGS. 2 and 3 are omitted in FIG. 5.

The first guide member GM1 and the second guide member GM2 may face each other in the second direction DR2. The display module DM may be disposed between the first guide member GM1 and the second guide member GM2.

The third guide member GM3 and the fourth guide member GM4 may face each other in the first direction DR1. The third guide member GM3 may be disposed between one end of the first guide member GM1 and one end of the second guide member GM2 and may be connected to the end of the first guide member GM1 and the end of the second guide member GM2.

The fourth guide member GM4 may be disposed between the other end of the first guide member GM1 opposite to the one end of the first guide member GM1 and the other end of the second guide member GM2 opposite to the one end of the second guide member GM2. The fourth guide member GM4 may be connected to the other end of the first guide member GM1 and the other end of the second guide member GM2.

The display device DD may include a plurality of driving units DU1, DU2 and DU3 and a coupling portion CP. The driving units DU1, DU2, and DU3 may be disposed on the guide member GM, and one end of the display module DM may be connected to some driving units among the driving units DU1, DU2, and DU3. Hereinafter, the configuration of the driving units DU1, DU2, and DU3 will be described in detail.

The display module DM may move backwards and forwards along the first and second guide members GM1 and GM2 in the first direction DR1 according to a rotation of the driving units DU1, DU2 and DU3. Accordingly, as shown in FIGS. 2 to 4, the exposed area of the display module DM may be changed, e.g., reduced or enlarged.

The other end of the display module DM, which is opposite to the one end of the display module DM, may be connected to the coupling portion CP. In an exemplary embodiment, the coupling portion CP may extend in the second direction DR2 and may be disposed between the first guide member GM1 and the second guide member GM2. In such an embodiment, the coupling portion CP may be disposed on a portion of the first guide member GM1 and a portion of the second guide member GM2, which are adjacent to the other end of the display module DM. The coupling portion CP may move backwards and forwards along the first and second guide members GM1 and GM2 in the first direction DR1 corresponding to the movement of the display module DM.

Figure 6:
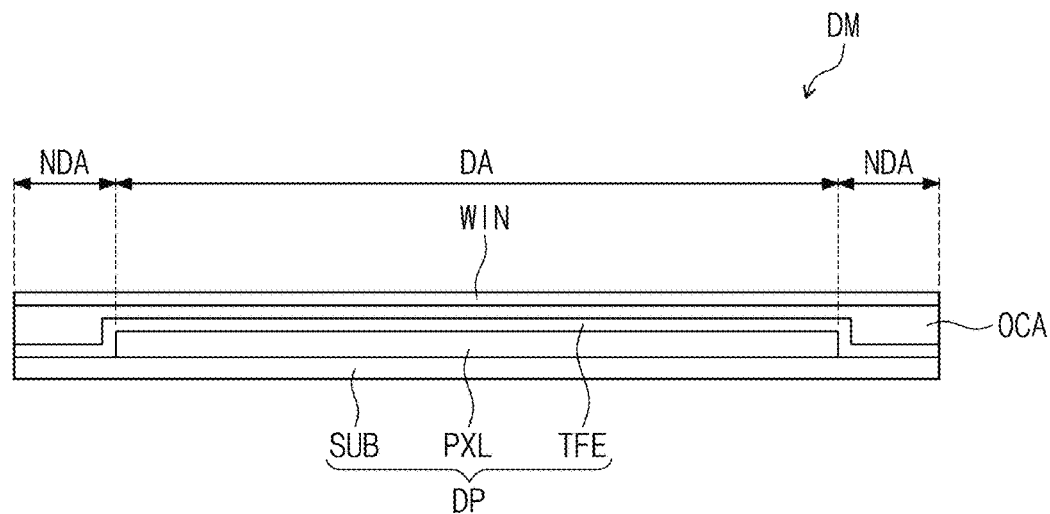
FIG. 6 is a view schematically showing a cross section of the display module shown in FIG. 5.

FIG. 6 is a view schematically showing a cross section of the display module DM shown in FIG. 5.

Referring to FIG. 6, in an exemplary embodiment, the display module DM may include a display panel DP, a window WIN disposed on the display panel DP, and an adhesive OCA disposed between the display panel DP and the window WIN. The window WIN may be in contact with a portion of the display panel DP and may be separated or spaced apart from the other portion of the display panel DP. This will be described later in greater detail. FIG. 6 shows the cross section of the display module DM including the window WIN and the display panel DP in contact with the window WIN.

In an exemplary embodiment, the display panel DP may be an organic light emitting display panel, but not being limited thereto. Alternatively, various display panels for displaying the image, such as a liquid crystal display panel, an electrowetting display panel, and an electrophoretic display panel, may be used as the display panel DP.

The display panel DP may include a base substrate SUB, a pixel layer PXL disposed on the base substrate SUB, and a thin film encapsulation layer TFE disposed on the base substrate SUB to cover the pixel layer PXL. The base substrate SUB may include a plastic film. The base substrate SUB may be a flexible substrate and may include a plastic substrate, a glass substrate, a metal substrate, or an organic/inorganic composite substrate, for example.

The base substrate SUB may include a display area DA and a non-display area NDA disposed adjacent to the display area DA. The pixel layer PXL may be disposed on the display area DA. The pixel layer PXL may include a plurality of pixels, and each pixel may include an organic light emitting diode.

In an exemplary embodiment, the thin film encapsulation layer TFE may include an inorganic layer and an organic layer. In one exemplary embodiment, for example, the thin film encapsulation layer TFE may include at least two inorganic layers and an organic layer disposed between the inorganic layers. The inorganic layers may include an inorganic material and may protect the pixel layer PXL from moisture and oxygen. The organic layer may include an organic material and may protect the pixel layer PXL from a foreign substance, such as a dust particle.

In an exemplary embodiment, the thin film encapsulation layer TFE may function as a protection member that protects the pixel layer PXL, but not being limited thereto or thereby. Alternatively, an encapsulation substrate, e.g., an encapsulation glass, may be further provided to be used as the protection member that protects the pixel layer PXL. The encapsulation substrate may be disposed on the substrate SUB, and the pixel layer PXL may be disposed between the encapsulation substrate and the substrate SUB. The encapsulation substrate may be coupled to the substrate SUB by a sealing member disposed on the non-display area NDA of the substrate SUB.

The encapsulation substrate may include a synthetic resin substrate or a glass substrate. The sealing member may include an inorganic adhesive member, such as a frit, but not being limited thereto or thereby. Alternatively, the sealing member may include an organic adhesive member. The pixel layer PXL is sealed from the outside by the encapsulation substrate and the sealing member, such that defects of a light emitting element due to moisture may be effectively prevented.

The window WIN may protect the display panel DP from external scratches and impacts. The window WIN may be attached to the display panel DP by the adhesive OCA. The adhesive OCA may include an optical clear adhesive.

The image generated by the display panel DP may be provided to the user after passing through the window WIN. Although not shown in figures, a touch sensing unit may be disposed between the window WIN and the display panel DP. The touch sensing unit may sense external touch, e.g., a user's finger or a touch pen.

Figure 7:
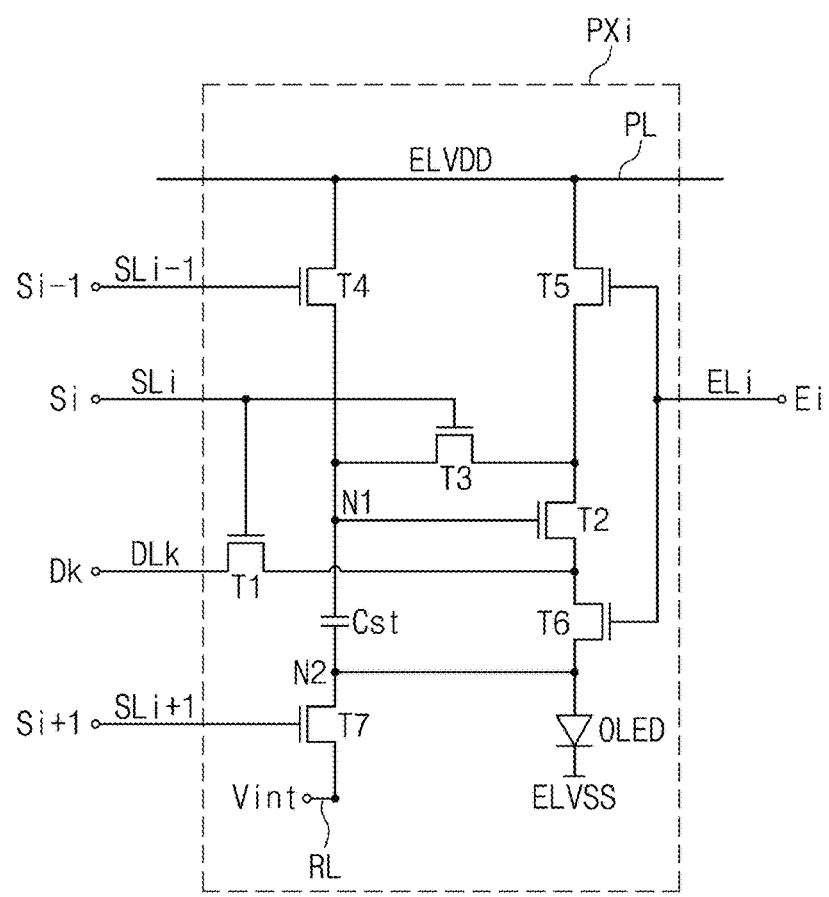
FIG. 7 is an equivalent circuit diagram showing a pixel disposed in a pixel layer shown in FIG. 6.
Figure 8:
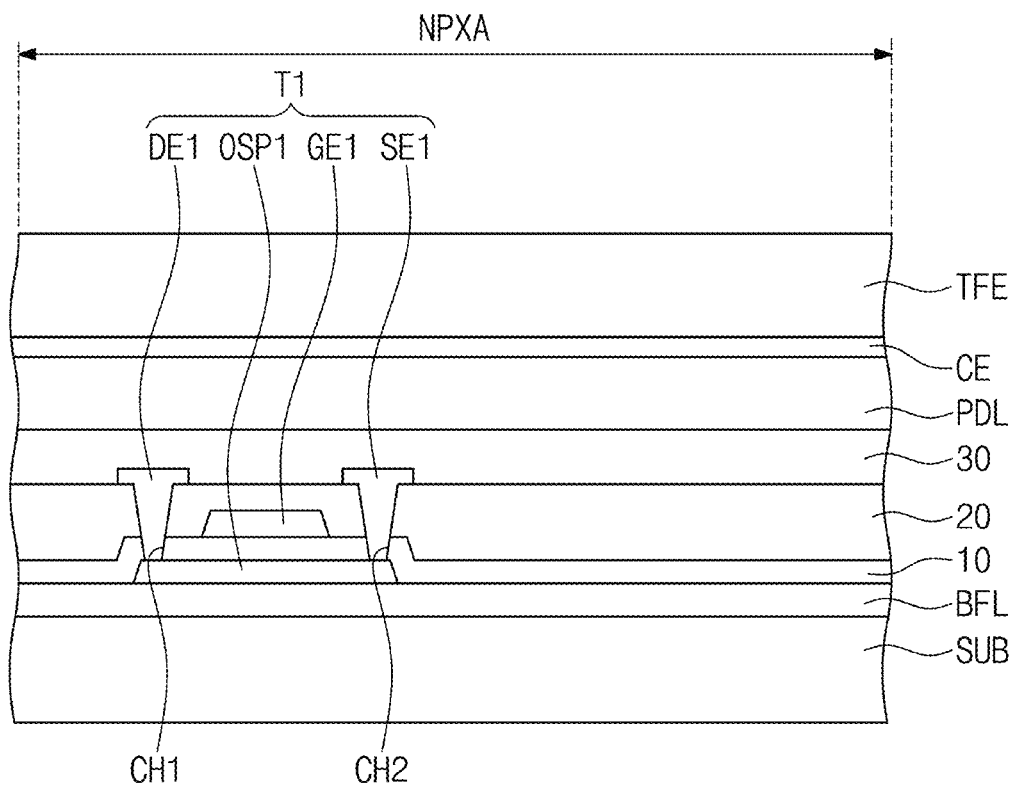
FIGS. 8 and 9 are views showing a cross section of the pixel shown in FIG. 7.
Figure 9:
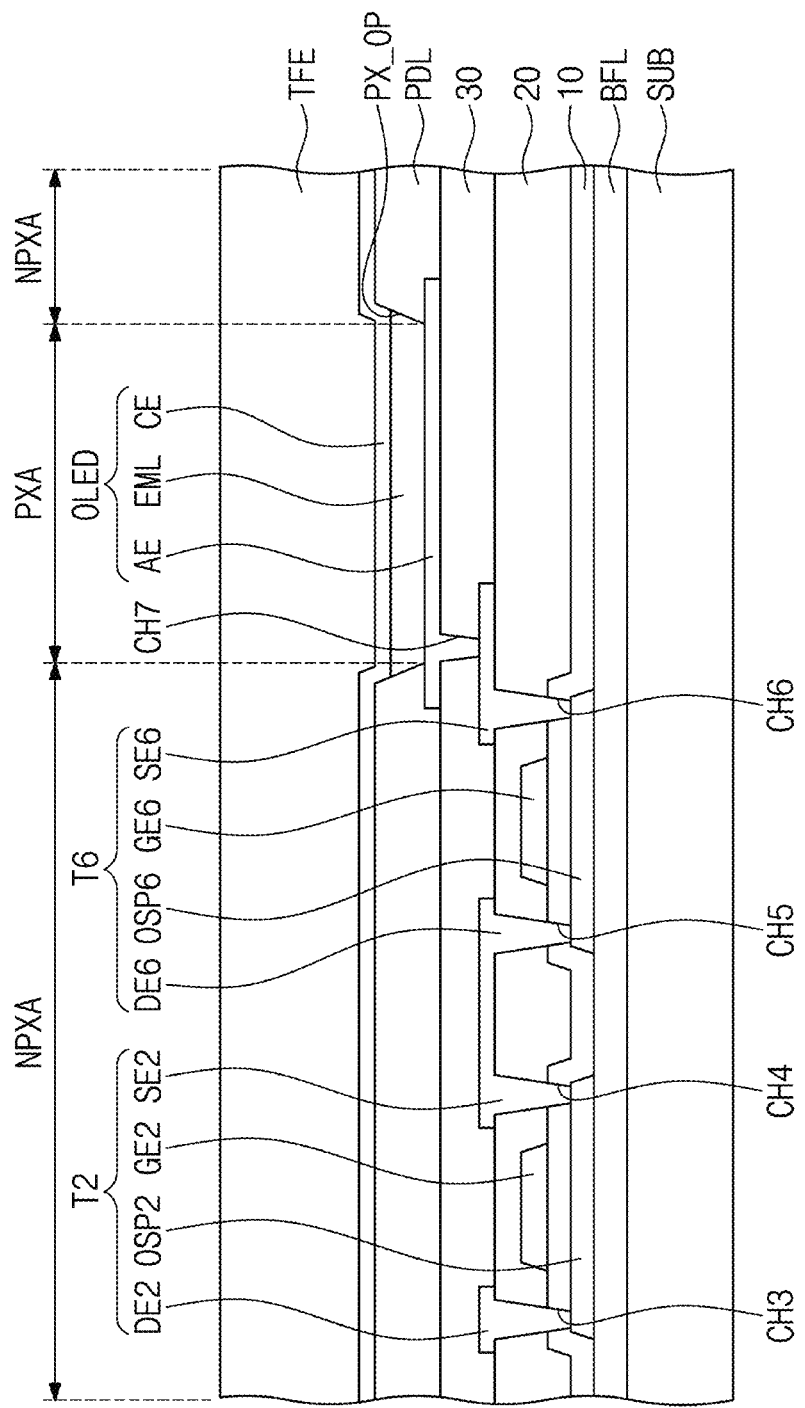

FIG. 7 is an equivalent circuit diagram showing a pixel disposed in the pixel layer PXL shown in FIG. 6. FIGS. 8 and 9 are views showing a cross-section of the pixel shown in FIG. 7.

FIG. 7 shows an i-th pixel PXi connected to a k-th data line DLk, and other pixels may have a structure substantially the same as that of the i-th pixel PXi shown in FIGS. 7 to 9. FIG. 8 shows a cross section of a portion corresponding to a first transistor T1 of the equivalent circuit diagram shown in FIG. 7. FIG. 9 shows a cross section of portions corresponding to a second transistor T2, a sixth transistor T6, and an organic light emitting diode OLED of the equivalent circuit diagram shown in FIG. 7.

Referring to FIG. 7, the i-th pixel PXi may include the organic light emitting diode OLED and a driving circuit that controls the organic light emitting diode OLED. The driving circuit may include seven thin film transistors T1 to T7 and a single capacitor Cst. Hereinafter, an exemplary embodiment where the seven thin film transistors T1 to T7 is N-type thin film transistors, but not being limited thereto. Alternatively, the seven thin film transistors T1 to T7 may be P-type thin film transistors.

A driving transistor may control a driving current supplied to the organic light emitting diode OLED. In an exemplary embodiment of the disclosure, the driving transistor may be a second transistor T2. An output electrode of the second transistor T2 may be electrically connected to the organic light emitting diode OLED. The output electrode of the second transistor T2 may be in direct contact with an anode of the organic light emitting diode OLED or may be connected to the anode of the organic light emitting diode OLED via another transistor, e.g., a sixth transistor T6.

A control electrode of a control transistor may receive a control signal. A control signal applied to the i-th pixel PXi may include an (i−1)-th scan signal Si−1, an i-th scan signal Si, an (i+1)-th scan signal Si+1, a data signal Dk, and an i-th light emitting control signal Ei. In an exemplary embodiment of the disclosure, the control transistor may include a first transistor T1 and third to seventh transistors T3 to T7.

A node between an output electrode of the fourth transistor T4 and a control electrode of the second transistor T2 is referred to as a "first node" N1, and a node between the seventh transistor T7 and the capacitor Cst is referred to as a "second node" N2. A power line PL receives a first voltage ELVDD and provides the first voltage ELVDD to the pixels PX.

The second transistor T2 may include an input electrode that receives the first voltage ELVDD via the fifth transistor T5, the control electrode connected to the first node N1, and the output electrode. The output electrode of the second transistor T2 may provide the first voltage ELVDD to the organic light emitting diode OLED via the sixth transistor T6. The input electrode of the second transistor T2 may be connected to the first node N1 via the third transistor T3. The second transistor T2 may control the driving current to be supplied to the organic light emitting diode OLED in response to an electric potential of the first node N1.

The first transistor T1 may include an input electrode connected to the k-th data line DLk, a control electrode connected to an i-th scan line SLi, and an output electrode connected to the output electrode of the second transistor T2. The first transistor T1 may be turned on in response to a scan signal (hereinafter, referred to as "i-th scan signal") Si applied to the i-th scan line SLi. The first transistor T1 may be referred to as a "switching transistor".

The third transistor T3 may include an input electrode connected to the input electrode of the second transistor T2, a control electrode connected to the i-th scan line SLi, and an output electrode connected to the first node N1. The third transistor T3 may be turned on in response to the i-th scan signal Si.

When the first transistor T1 and the third transistor T3 are turned on, the second transistor T2 may be connected between the first transistor T1 and the third transistor T3 in a diode configuration. The first transistor T1 may be connected to the first node N1 via the second transistor T2 and the third transistor T3. Accordingly, the data signal Dk applied to the k-th data line DLk may be provided to the capacitor Cst.

The capacitor Cst may be connected between the first node N1 and the anode of the organic light emitting diode OLED. The capacitor Cst may be charged with a voltage corresponding to the voltage applied to the first node N1.

The fourth transistor T4 may include an input electrode connected to the power line PL, a control electrode receiving the (i−1)-th scan signal Si−1, and an output electrode connected to the first node N1. The fourth transistor T4 may be switched in response to the (i−1)-th scan signal Si−1. The control electrode of the fourth transistor T4 may be connected to an (i−1)-th scan line SLi−1. A signal line to which the (i−1)-th scan signal Si−1 is applied may be changed to a dummy signal line.

The fifth transistor T5 may include an input electrode connected to the power line PL, a control electrode connected to an i-th light emitting line ELi, and an output electrode connected to the input electrode of the second transistor T2. The fifth transistor T5 may be turned on in response to the i-th light emitting control signal Ei.

The sixth transistor T6 may include an input electrode connected to the output electrode of the second transistor T2, a control electrode connected to the i-th light emitting line ELi, and an output electrode connected to the anode of the light emitting diode OLED. The sixth transistor T6 may be turned on in response to the i-th light emitting control signal Ei provided from the i-th light emitting line ELi.

A current path may be formed or blocked between the power line PL and the organic light emitting diode OLED depending on the operation of the fifth transistor T5 and the sixth transistor T6. In an alternative exemplary embodiment of the disclosure, one of the fifth transistor T5 and the sixth transistor T6 may be omitted.

The seventh transistor T7 may include an input electrode connected to an initialization line RL, a control electrode receiving the (i+1)-th scan signal Si+1, and an output electrode connected to the anode of the organic light emitting diode OLED. The control electrode of the seventh transistor T7 may be connected to an (i+1)-th scan line SLi+1. A signal line to which the (i+1)-th scan signal Si+1 is applied may be changed to the dummy signal line.

When the fourth transistor T4 is turned on, the first node N1 may be reset by the first voltage ELVDD. When the seventh transistor T7 is turned on, the second node N2 may be initialized by an initialization voltage Vint. The anode of the organic light emitting diode OLED may be initialized by the initialization voltage Vint when the seventh transistor T7 is turned on. A difference in electric potential between the initialization voltage Vint and a second voltage ELVSS applied to a cathode of the organic light emitting diode OLED may be lower than a voltage level of a light emitting threshold voltage of the organic light emitting diode OLED.

Referring to FIGS. 8 and 9, the first transistor T1, the second transistor T2, and the sixth transistor T6 may be disposed on the base substrate SUB. Since the first, second, and sixth transistors T1, T2, and T6 have substantially the same configuration as each other, the configuration of the first transistor T1 will hereinafter be described in detail, and any repetitive detailed descriptions on the configuration of the second and sixth transistors T2 and T6 will be omitted for convenience of description.

An upper surface of the base substrate SUB may be a plane or flat surface defined by the first direction DR1 and the second direction DR2. The first transistor T1 may include a first input electrode DE1, a first output electrode SE1, a first control electrode GE1, and a first oxide semiconductor pattern OSP1.

A buffer layer BFL may be disposed on the upper surface of the base substrate SUB. The buffer layer BFL may include an inorganic material. The first oxide semiconductor pattern OSP1 may be disposed on the buffer layer BFL. The first oxide semiconductor pattern OSP1 may include indium-tin oxide ("ITO"), indium-gallium-zinc oxide ("IGZO"), zinc oxide (ZnO), indium-zinc oxide ("IZO"), or the like.

Although not shown in figures, the first oxide semiconductor pattern OSP1 may include a first area (or an input area), a second area (or an output area), and a channel area between the first area and the second area. The first area may be disposed on an opposite side of the second area.

A first insulating layer 10 may be disposed on the first oxide semiconductor pattern OSP1. The first control electrode GE1 may be disposed on the first insulating layer 10, and a second insulating layer 20 may be disposed on the first insulating layer 10 to cover the first control electrode GE1. The second insulating layer 20 may provide a flat upper surface on layers therebelow. The first insulating layer 10 may include an inorganic material. The second insulating layer 20 may include an organic material and/or an inorganic material.

A first contact hole CH1 and a second contact hole CH2 may be defined through the first and second insulating layers 10 and 20 to expose the first area and the second area. Each of the first contact hole CH1 and the second contact hole CH2 may penetrate through the first insulating layer 10 and the second insulating layer 20.

The first input electrode DE1 and the first output electrode SE1 may be disposed on the second insulating layer 20. The first input electrode DE1 and the first output electrode SE1 may be connected to the first area and the second area of the first oxide semiconductor pattern OSP1 through the first contact hole CH1 and the second contact hole CH2, respectively.

A third insulating layer 30 may be disposed on the second insulating layer 20 to cover the first input electrode DE1 and the first output electrode SE1. The third insulating layer 30 may provide a flat upper surface on layers therebelow. The third insulating layer 30 may include an organic material and/or an inorganic material.

FIG. 9 shows the structure of the second transistor T2 and the structure of the sixth transistor T6, which have substantially the same structure as each other. The second transistor T2 may include a second input electrode DE2, a second output electrode SE2, a second control electrode GE2 and a second oxide semiconductor pattern OSP2, and the sixth transistor T6 may include a sixth input electrode DE6, a sixth output electrode SE6, a sixth control electrode GE6 and a sixth oxide semiconductor pattern OSP6. The sixth input electrode DE6 of the sixth transistor T6 may be connected to the second output electrode SE2 of the second transistor T2 on the second insulating layer 20.

A pixel definition layer PDL and the organic light emitting diode OLED may be disposed on the third insulating layer 30. The anode AE may be disposed on the third insulating layer 30. The anode AE may be connected to the sixth output electrode SE6 of the sixth transistor T6 through a seventh contact hole CH7 defined through the third insulating layer 30. A pixel opening PX_OP may be defined through the pixel definition layer PDL. At least a portion of the anode AE may be exposed through the pixel opening PX_OP of the pixel definition layer PDL.

The pixel PX may be disposed in a pixel area on a plane surface of the organic light emitting display panel DP. The pixel area may include a light emitting area PXA and a non-light emitting area NPXA disposed adjacent to the light emitting area PXA. The non-light emitting area NPXA may be disposed to surround the light emitting area PXA. The light emitting area PXA may be defined to correspond to an area of the anode AE exposed through the pixel opening PX_OP.

An organic light emitting layer EML may be disposed on the anode AE in the pixel opening PX_OP. The organic light emitting layer EML may generate a light with one of red, green and blue colors, but not being limited thereto or thereby. Alternatively, the organic light emitting layer EML may generate a white light by a combination of lights from organic materials that generate red, green and blue color lights, respectively.

The cathode CE may be disposed on the organic light emitting layer EML. The cathode CE may be commonly disposed in the pixels PX. The thin film encapsulation layer TFE may be disposed on the cathode CE. Although not shown in figures, a capping layer may be further disposed to cover the cathode CE, and the thin film encapsulation layer TFE may cover the capping layer.

Figure 10:
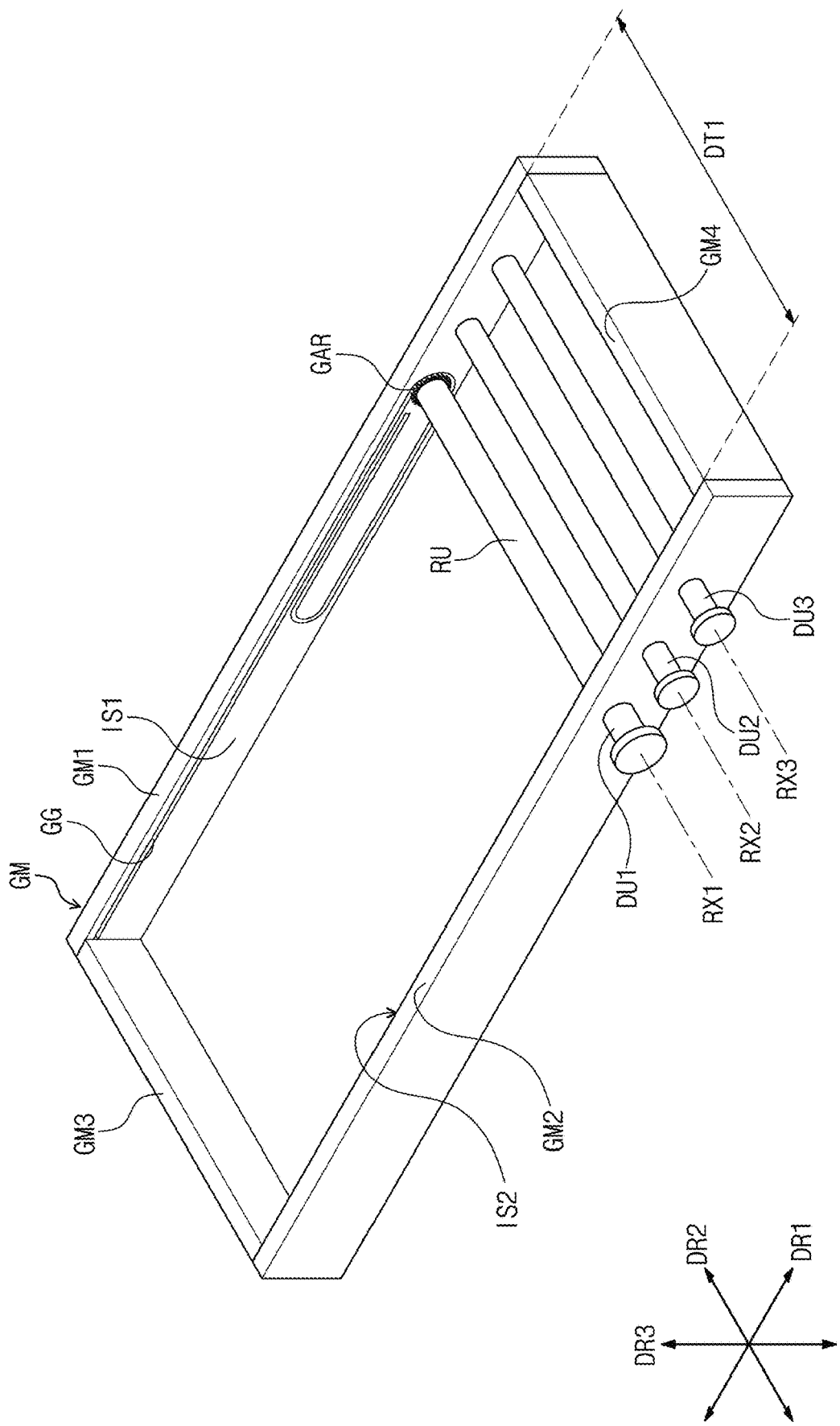
FIG. 10 is a perspective view showing an exemplary embodiment of a guide member and driving units connected to the guide member shown in FIG. 5.
Figure 11:
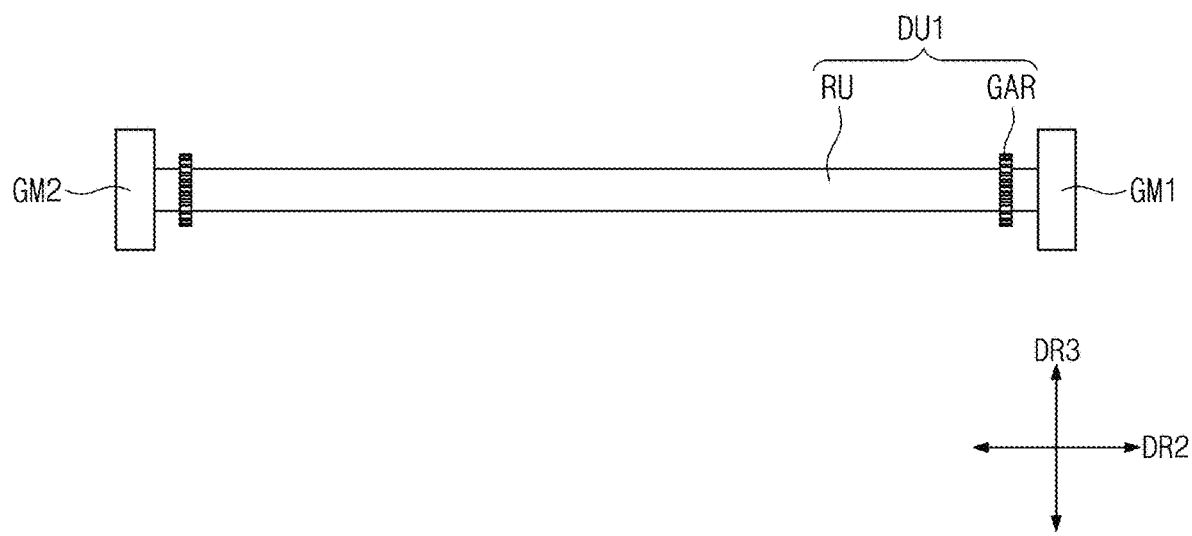
FIG. 11 is a view showing an exemplary embodiment of a first driving unit shown in FIG. 10.

FIG. 10 is a perspective view showing an exemplary embodiment of the guide member and the driving units connected to the guide member shown in FIG. 5. FIG. 11 is a view showing an exemplary embodiment of a first driving unit shown in FIG. 10.

Referring to FIGS. 10 and 11, the first, second, and third driving units DU1, DU2, and DU3 may be disposed between the first guide member GM1 and the second guide member GM2 and may extend in the second direction DR2 to be connected to the first guide member GM1 and the second guide member GM2. The first, second, and third driving units DU1, DU2, and DU3 may be protruded to the outside after penetrating through the first guide member GM1 and the second guide member GM2.

The first, second, and third driving units DU1, DU2, and DU3 may be arranged in the first direction DR1 and may be disposed closer to the fourth guide member GM4 than to the third guide member GM3 is. The third driving unit DU3 may be disposed closer to the fourth guide member GM4 than the first and second driving units DU1 and DU2 are. The second driving unit DU2 may be disposed closer to the fourth guide member GM4 than the first driving unit DU1 is. The second driving unit DU2 may be disposed between the first driving unit DU1 and the third driving unit DU3.

The first, second, and third driving units DU1, DU2, and DU3 may rotate with respect to rotation axes RX1, RX2, and RX3 substantially parallel to the second direction DR2. In one exemplary embodiment, for example, the first driving unit DU1 may rotate with respect to a first rotation axis RX1 substantially parallel to the second direction DR2. In such an embodiment, the second driving unit DU2 may rotate with respect to a second rotation axis RX2 substantially parallel to the second direction DR2. In such an embodiment, the third driving unit DU3 may rotate with respect to a third rotation axis RX3 substantially parallel to the second direction DR2.

The first, second, and third driving units DU1, DU2, and DU3 may rotate in a same direction as each other. In an exemplary embodiment, the first, second, and third driving units DU1, DU2, and DU3 may rotate in a clockwise direction or in a counter-clockwise direction.

A guide groove GG may be defined in each of an inner side surface IS1 of the first guide member GM1 and an inner side surface IS2 of the second guide member GM2, which faces the inner side surface IS1 of the first guide member GM1. In FIG. 10, the guide groove GG defined in the inner side surface IS1 of the first guide member GM1 is shown, and although not shown in FIG. 10, the guide groove GG may be defined in the inner side surface IS2 of the second guide member GM2.

Portions of the first guide member GM1 and the second guide member GM2 may be inwardly recessed from the inner side surface IS1 and the inner side surface IS2 thereof, respectively, and thus the guide groove GG may be defined.

The guide groove GG may extend from an area adjacent to the first driving unit DU1 to the third guide member GM3. In an exemplary embodiment, the guide groove GG may be defined from a portion of the first guide member GM1 adjacent to the first driving unit DU1 to a portion of the first guide member GM1 adjacent to the third guide member GM3. The shape of the guide groove GG will be described later in greater detail with reference to FIG. 12.

The second driving unit DU2 and the third driving unit DU3 may be disposed between the guide groove GG and the fourth guide member GM4. The first driving unit DU1 may include a rotation axis unit RU extending in the second direction DR2 and a gear unit GAR disposed at a predetermined portion of the rotation axis unit RU. The rotation axis unit RU may provide the first rotation axis RX1. The rotation axis unit RU may have a cylindrical shape and may be disposed between the first guide member GM1 and the second guide member GM2 to be connected to the first guide member GM1 and the second guide member GM2.

The gear unit GAR may be disposed on an outer circumferential surface of predetermined portions of the rotation axis unit RU, which are adjacent to the first and second guide members GM1 and GM2, respectively.

The second and third driving units DU2 and DU3 disposed between the first guide member GM1 and the second guide member GM2 may have a cylindrical shape. The rotation axis unit RU of the first driving unit DU1 may have a diameter greater than a diameter of each of the second and third driving units DU2 and DU3 disposed between the first guide member GM1 and the second guide member GM2. A distance in the second direction DR2 between the first guide member GM1 and the second guide member GM2 may be referred to as a "first distance" DT1.

In an exemplary embodiment, as described in detail below, the display module DM may be connected to the second and third driving units DU2 and DU3. In such an embodiment, the support member disposed under the display module DM may be coupled to the first driving unit DU1.

Figure 12:
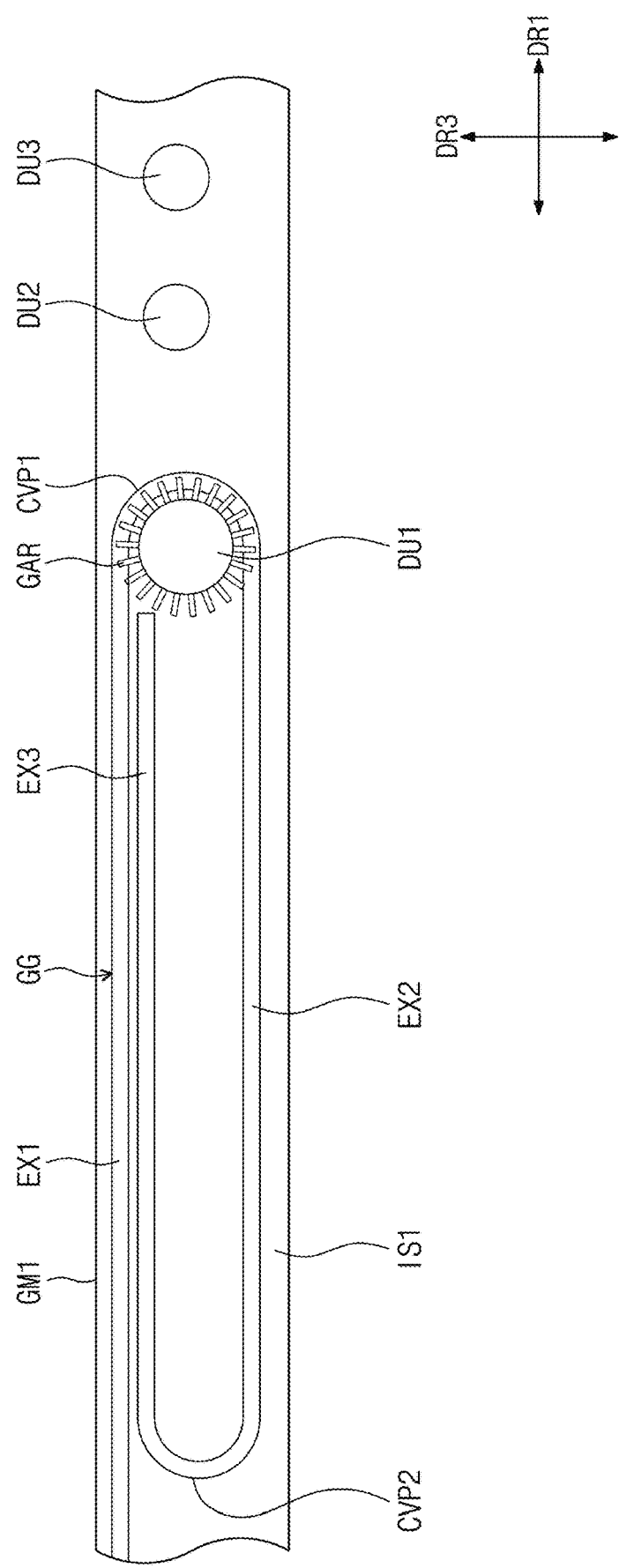
FIG. 12 is a view showing an inner side surface of a first guide member shown in FIG. 10.

FIG. 12 is a view showing the inner side surface IS1 of the first guide member GM1 shown in FIG. 10.

Although not shown in figures, the inner side surface IS2 of the second guide member GM2 may have substantially the same configuration as that of the inner side surface IS1 of the first guide member GM1.

Referring to FIG. 12, the guide groove GG may include a first extension portion EX1, a second extension portion EX2, a third extension portion EX3, a first curved portion CVP1, and a second curved portion CVP2. The first extension portion EX1, the second extension portion EX2, and the third extension portion EX3 extend in the first direction DR1, and the first curved portion CVP1 and the second curved portion CVP2 may have a curved shape.

One end of the first extension portion EX1, one end of the second extension portion EX2, and one end of the third extension portion EX3 may be defined as portions adjacent to the first driving unit DU1. The other end of the first extension portion EX1 may be defined as an opposite end to the one end of the first extension portion EX1, the other end of the second extension portion EX2 may be defined as an opposite end to the one end of the second extension portion EX2, and the other end of the third extension portion EX3 may be defined as an opposite end to the one end of the third extension portion EX3.

A length in the first direction DR1 of each of the second extension portion EX2 and the third extension portion EX3 may be smaller than that of the first extension portion EX1. The length in the first direction DR1 of the third extension portion EX3 may be smaller than the length in the first direction DR1 of the second extension portion EX2. The second extension portion EX2 may be disposed under the first extension portion EX1. The third extension portion EX3 may be disposed between the first extension portion EX1 and the second extension portion EX2.

The first curved portion CVP1 may extend from the one end of the first extension portion EX1 to the one end of the second extension portion EX2, which is adjacent to the one end of the first extension portion EX1, in a curved shape. The curved shape of the first curved portion CVP1 may correspond to a convexly curved shape to the second driving unit DU2. The first driving unit DU1 may be disposed adjacent to the first curved portion CVP1.

The second curved portion CVP2 may extend from the other end of the second extension portion EX2 to the other end of the third extension portion EX3, which is adjacent to the other end of the second extension portion EX2, in a curved shape. In one exemplary embodiment, for example, each of the first and second curved portions CVP1 and CVP2 may be in a semi-circular shape, as shown in FIG. 12, but not being limited to the semi-circular shape as long as each of the first and second curved portions CVP1 and CVP2 has the curved shape. A direction in which the first curved portion CVP1 is curved may be opposite to a direction in which the second curved portion CVP2 is curved.

Figure 13:
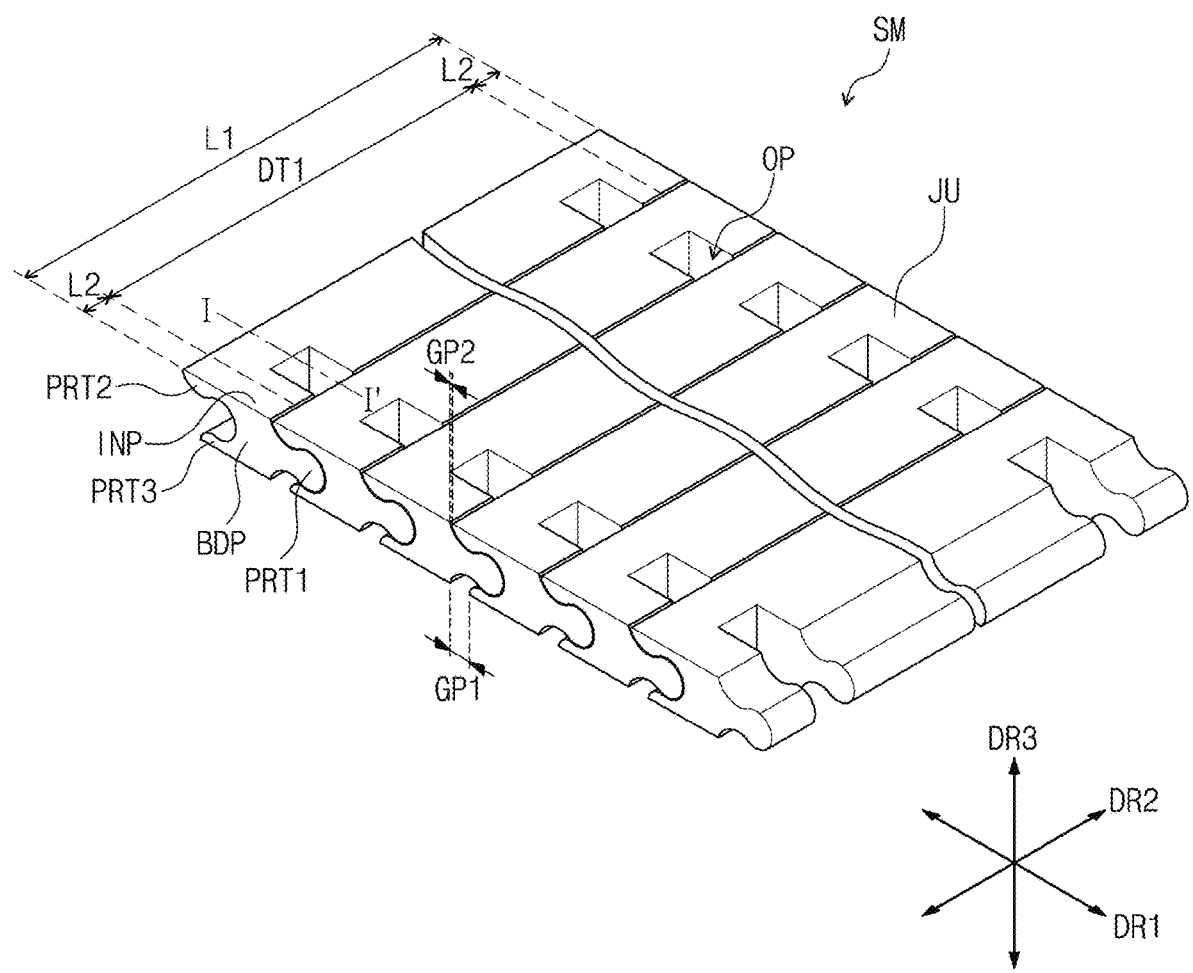
FIG. 13 is view showing a configuration of a support member disposed on the guide member shown in FIG. 5.
Figure 14:
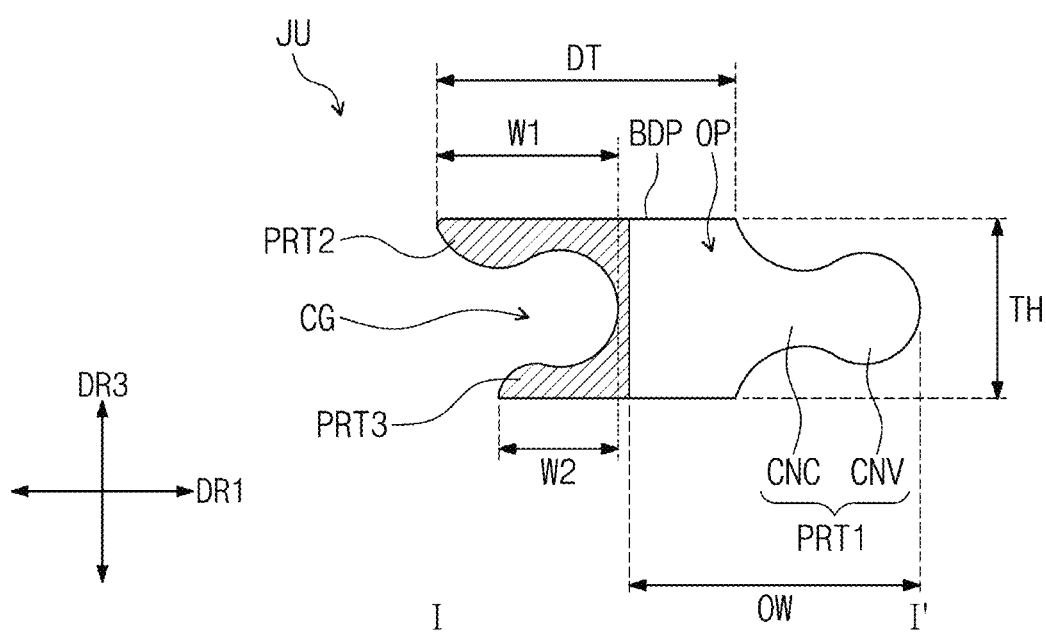
FIG. 14 is a cross-sectional view taken along line I-I' shown in FIG. 13.

FIG. 13 is view showing a configuration of the support member disposed on the guide member shown in FIG. 5. FIG. 14 is a cross-sectional view taken along line I-I' shown in FIG. 13.

For the convenience of illustration and description, FIG. 14 shows a cross section of one joint unit JU.

Referring to FIGS. 13 and 14, the support member SM may include a plurality of joint units JU that extend in the second direction DR2, arranged in the first direction DR1, and coupled to each other to rotate together. FIG. 13 shows an exemplary embodiment where the support member SM includes six joint units JU, but not being limited thereto. In an alternative exemplary embodiment, the support member SM may include more joint units JU than six. The joint units JU may include a metal material. Since the joint units JU have the same configurations as each other, hereinafter, the configuration of one joint unit JU will be described in detail.

The joint unit JU may have a first length L1 in the second direction DR2. The first length L1 may be longer than the first distance DT', which is the distance in the second direction DR2 between the first guide member GM1 and the second guide member GM2. Predetermined portions of the joint unit JU, which are respectively adjacent to both sides of the joint units JU, may be referred to as insertion portions INP. Each of the insertion portions INP may have a second length L2 in the second direction DR2. The first length L1 may be equal to a sum of the first distance DT1 and two second lengths L2.

In an exemplary embodiment, both ends of each of the joint units JU, which define both sides of the support member SM, may be inserted into the guide grooves GG, respectively. In such an embodiment, the insertion portions INP of the joint unit JU may be respectively inserted into the guide grooves GG.

In an exemplary embodiment, as shown in FIG. 14, the joint unit JU may include a body portion BDP, a first protrusion portion PRT1, a second protrusion portion PRT2, and a third protrusion PRT3. The body portion BDP may extend in the second direction DR2. The first protrusion portion PRT1 may be protruded from one end of the body portion BDP in the first direction DR1. The second protrusion portion PRT2 may be protruded from an upper end of the other end of the body portion BDP, which is opposite end of the one end of the body portion BDP, in the first direction DR1. The third protrusion portion PRT3 may be protruded from a lower end of the other end of the body portion BDP in the first direction DR1.

A first protrusion portion PRT1 of an h-th joint unit JU may be inserted into a groove portion CG defined between second and third protrusion portions PRT2 and PRT3 of a next join unit, e.g., an (h+1)-th joint unit JU. Accordingly, the h-th joint unit JU and the (h+1)-th joint unit JU may be coupled to each other. Here, "h" is a natural number. An entrance of the groove portion CG may be smaller than an inner portion of the groove portion CG As an example, a thickness TH of the body portion BDP, which is defined by a distance between upper and lower surfaces of the body portion BDP in the third direction DR3, may be in a range from about 1.4 millimeters (mm) to about 1.6 mm. In the first direction DR1, a distance DT between the one end of the body portion BDP and an end of the second protrusion portion PRT2 may be in a range from about 1.8 mm to about 2.0 mm.

A first width W1 in the first direction DR1 of the second protrusion portion PRT2 may be greater than a second width W2 in the first direction DR1 of the third protrusion portion PRT3. Accordingly, a first gap GP1 between an end of the third protrusion portion PRT3 of the (h+1)-th joint unit JU and a lower end of the body portion BDP of the h-th joint unit JU may be greater than a second gap GP2 between an end of the second protrusion portion PRT2 of the (h+1)-th joint unit JU and an upper end of the body portion BDP of the h-th joint unit JU.

The first gap GP1 may be defined by a gap between the lower ends of the joint units JU adjacent to each other. The second gap GP2 may be defined by a gap between the upper ends of the joint units JU adjacent to each other. In one exemplary embodiment, for example, the first gap GP1 may be in a range from about 0.3 mm to about 0.8 mm. The second gap GP2 may be greater than about zero (0) mm and equal to or smaller than about 0.1 mm.

The first protrusion portion PRT1 may include a concave portion CNC extending in the first direction DR1 from the one end of the body portion BDP and a convex portion CNV extending in the first direction DR1 from the concave portion CNC. When viewed from a plan view in the second direction DR2, upper and lower surfaces of the concave portion CNC may have a concave shape. When viewed from the plan view in the second direction DR2, the convex portion CNV may have an oval-like shape.

In an exemplary embodiment, as shown in FIG. 14, as a distance from the body portion BDP becomes larger, a thickness of the first protrusion portion PRT1 gradually decreases and then increases again. The end of the first protrusion portion PRT1 may have a convex curved shape. The groove portion CG may have a shape corresponding to the concave portion CNC and the convex portion CNV.

Openings OP may be defined in the predetermined portions of the joint unit JU, which are adjacent to the both sides of the joint unit JU. The openings OP may be defined by penetrating the predetermined portions of the joint unit JU in the third direction DR3. In an exemplary embodiment of the disclosure, the openings OP are defined in all the joint units JU, but not being limited thereto or thereby. Alternatively, the openings OP may be defined in some joint units JU among the joint units JU.

The openings OP may extend from the predetermined portions of the body portion BDP to the end of the first protrusion portion PRT1 in the first direction DR1. In an exemplary embodiment, the openings OP may be defined by being recessed from the predetermined portions of the first protrusion portion PRT1 to the predetermined portions of the body portion BDP in the first direction DR1.

A width OW of the openings OP may be defined by a distance between the inner side surface of the body portion BDP, through which the opening OP is defined, and the end of the first protrusion portion PRT1 in the first direction DR1. The openings OP may be disposed to correspond to the protrusions of the gear unit GAR, and this configuration will hereinafter be described in detail with reference to FIGS. 15 and 16.

Figure 15:
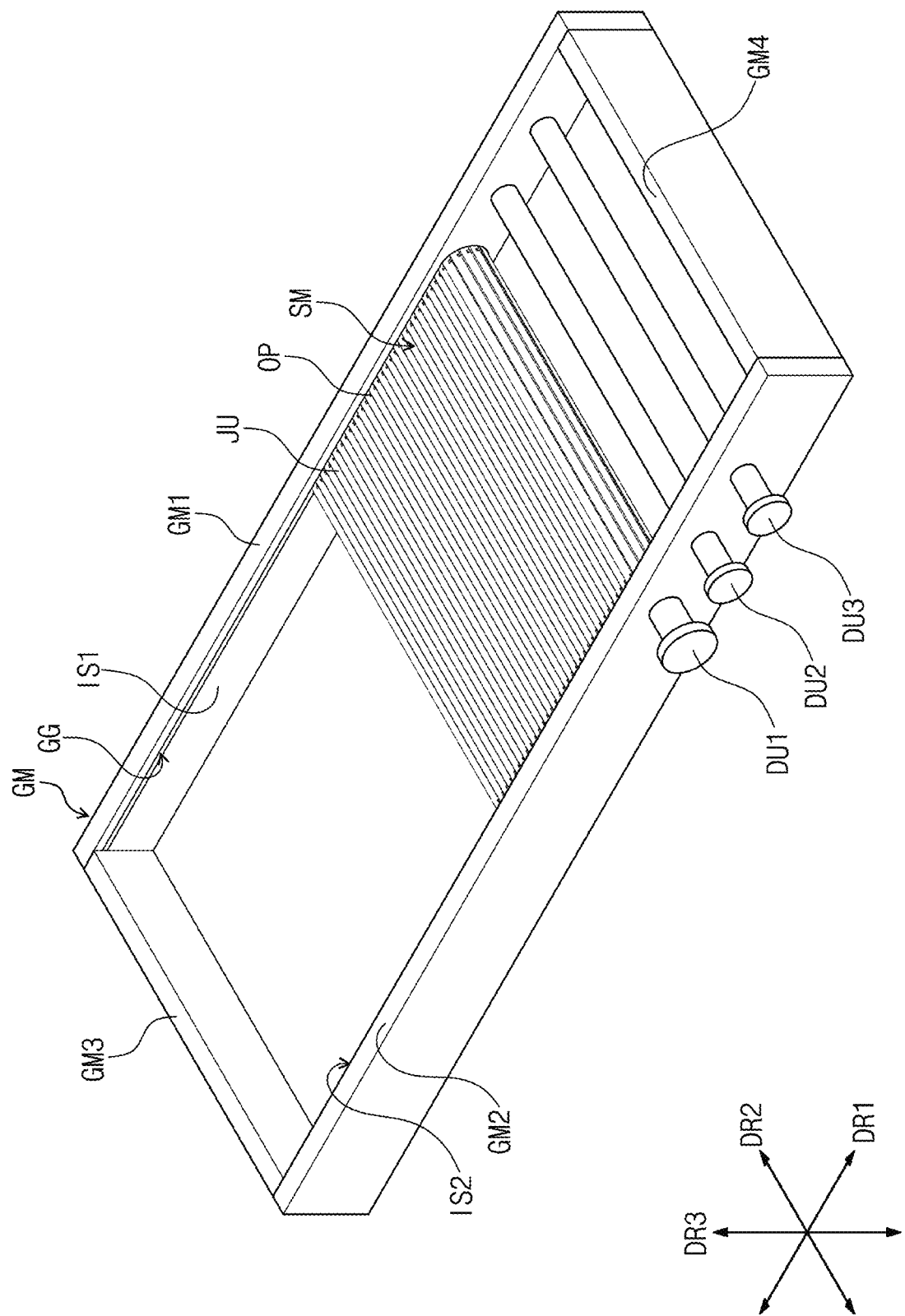
FIG. 15 is a perspective view showing a configuration of the support member shown in FIG. 13 disposed on first and second guide members.
Figure 16:
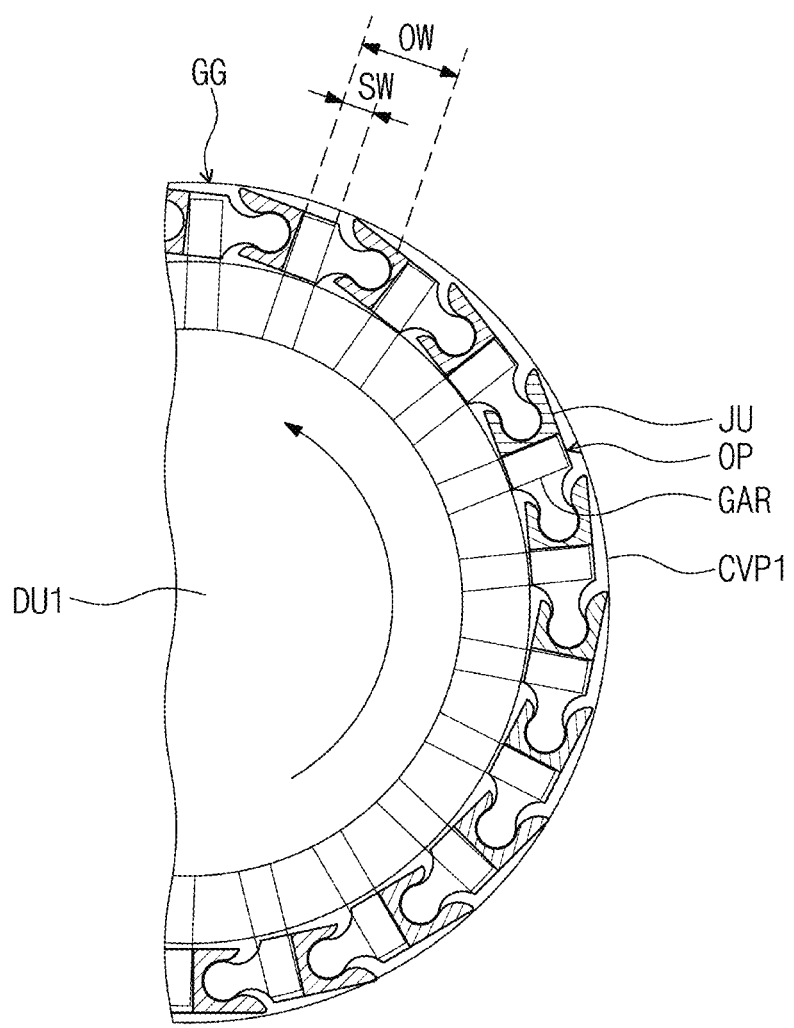
FIG. 16 is a cross-sectional view showing a configuration in which protrusions of a gear unit inserted into openings.

FIG. 15 is a perspective view showing a configuration of the support member shown in FIG. 13 disposed on the first and second guide members. FIG. 16 is a cross-sectional view showing a configuration in which the protrusions of the gear unit inserted into the openings.

Referring to FIGS. 15 and 16, the both sides of the support member SM may be respectively inserted into the guide grooves GG of the first and second guide members GM1 and GM2. In one exemplary embodiment, for example, the insertion portions INP of each of the joint units JU shown in FIG. 14 may be respectively inserted into the guide grooves GG In such an embodiment, since the both sides of the joint units JU are inserted into the guide grooves GG; the joint units JU may be supported by the first and second guide members GM1 and GM2. The openings OP may be defined in the predetermined portions of each of the joint units JU adjacent to the first and second guide members GM1 and GM2.

The both sides of the joint units JU may be disposed on a predetermined portion of the first extension portion EX1 adjacent to the first driving unit DU1, the second extension portion EX2, the third extension portion EX3, and the first and second curved portions CVP1 and CVP2. The placement and movement of the joint units JU will be described later in detail with reference to FIGS. 18 and 19.

In an exemplary embodiment, as shown in FIG. 16, the protrusions of the gear unit GAR of the first driving unit DU1 may be inserted into the openings OP of the joint units JU disposed on the first curved portion CVP1 among the joint units JU. A width SW of each of the protrusions, which is defined by a distance between both sides of each of the protrusions of the gear unit GAR, may be smaller than the width OW of each of the openings OP. The widths SW and OW of the protrusions and the openings OP may be determined with reference to the first direction DR1.

As described above with reference to FIG. 13, when the joint units JU are disposed in a flat shape, lower ends of the joint units JU adjacent to each other may be spaced apart from each other by the first gap GP1, and upper ends of the joint units JU adjacent to each other are spaced apart from each other by the second gap GP2 smaller than the first gap GP1.

When the both sides of the joint units JU are disposed in the first curved portion CVP1, the lower ends of the joint units JU adjacent to each other may become narrower than the first gap GP1, the upper ends of the joint units JU adjacent to each other may become wider than the second gap GP2, and the joint units JU may be easily disposed in the first curved portion CVP1. That is, when the both sides of the joint units JU are disposed in the first curved portion CVP1, the joint units JU may be arranged along the first curved portion CVP1 in a curved shape.

Although not shown in figures, when the both sides of the joint units JU are disposed in the second curved portion CVP2, the lower ends of the joint units JU adjacent to each other may become narrower than the first gap GP1, the upper ends of the joint units JU adjacent to each other may become wider than the second gap GP2, and thus the joint units JU may be arranged along the second curved portion CVP2 in a curved shape.

When the first driving unit DU1 rotates, the protrusions of the gear unit GAR rotate after being disposed in the openings OP of the joint units JU disposed in the first curved portion CVP1, thereby moving the joint units JU. In such an embodiment, the first driving unit DU1 may be coupled to the support member SM to move the support member SM along the guide grooves GG of the first and second guide members GM1 and GM2.

Figure 17:
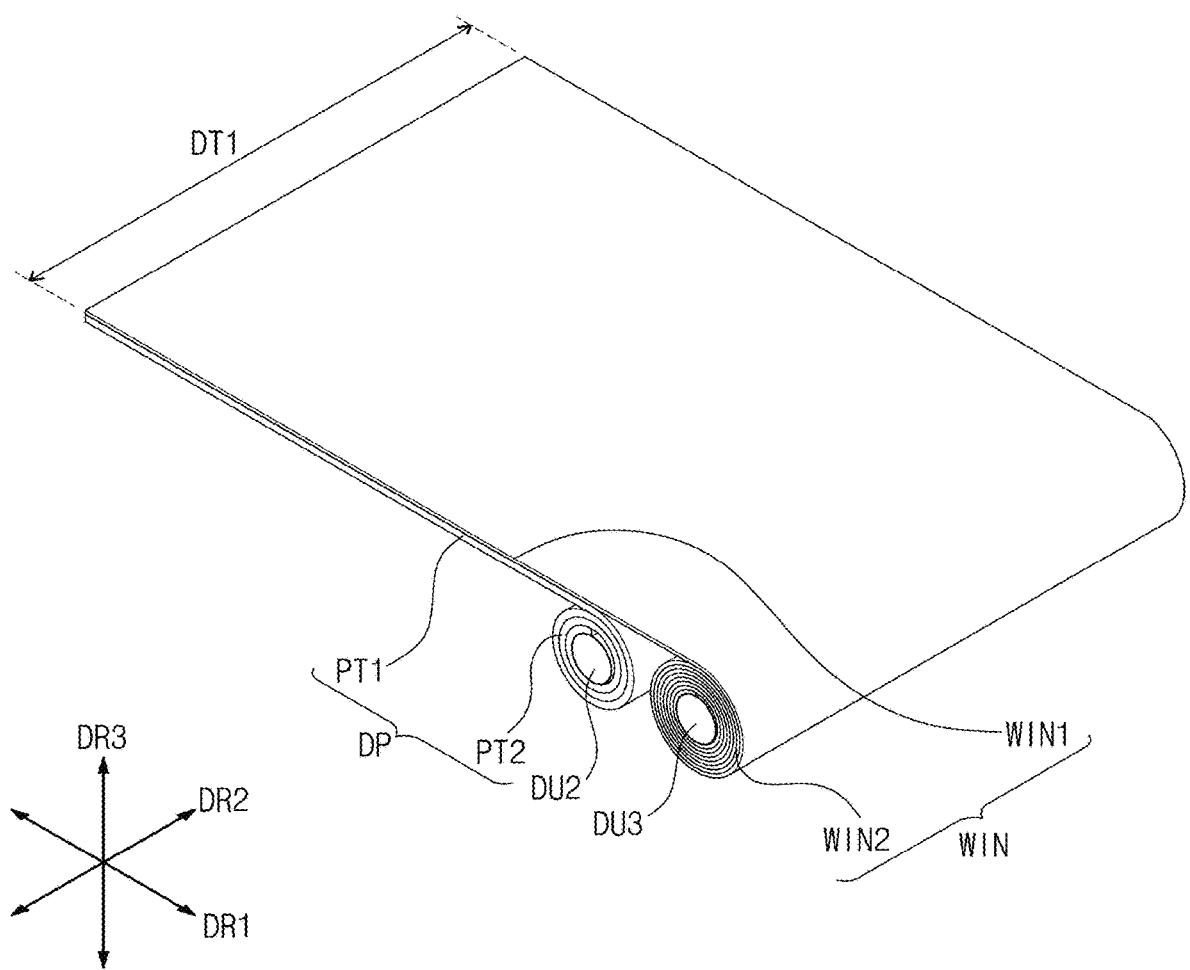
FIG. 17 is a perspective view showing a display module connected to second and third driving units shown in FIG. 15.

FIG. 17 is a perspective view showing the display module DM connected to the second and third driving units DU2 and DU3 shown in FIG. 15.

Referring to FIG. 17, the display panel and the window are connected to the second and third driving units, respectively. One end of the display panel DP of the display module DM may be connected to the second driving unit DU2. The display panel DP may be rolled or unrolled by the second driving unit DU2. The display panel DP may include a first portion PT1 that is unrolled and stretched to be in a flat state and a second portion PT2 that extends in the first direction DR1 from the first portion PT1 and is rolled on the second driving unit DU2. The one end of the display panel DP may correspond to an end of the second portion PT2.

The first portion PT1 is a portion that is not rolled on the second driving unit DU2 and an area of the first portion PT1 may vary depending on the rotation of the second driving unit DU2. The second portion PT2 may vary depending on the rotation of the second driving unit DU2. In one exemplary embodiment, for example, when the second driving unit DU2 rotates in the clockwise direction, the first portion PT1 may decrease, and the second portion PT2 may increase. In such an embodiment, when the second driving unit DU2 rotates in the counter-clockwise direction, the first portion PT1 may increase, and the second portion PT2 may decrease.

One end of the window WIN of the display module DM may be connected to the third driving unit DU3. The window WIN may be in contact with the first portion PT1 of the display panel DP and may be separated or spaced apart from the second portion PT2 of the display panel DP. The window WIN may include a first window WIN1 disposed on the first portion PT1 to contact the first portion PT1 and a second window WIN2 separated or spaced apart from the second portion PT2 and connected to the third driving unit DU3.

The first window WIN1 may correspond to a portion of the window WIN that is unrolled, and the second window WIN2 may correspond to a portion of the window WIN that is rolled on the third driving unit DU3. The second window WIN2 may extend from the first window WIN1 to the first direction DR1 and may be rolled on the third driving unit DU3. The one end of the window WIN may be defined as an end of the second window WIN2.

The first portion PT1 of the display panel DP may be exposed to the outside through the window WIN that is transparent. The second portion PT2 of the display panel DP may be accommodated in the case CS not to be exposed to the outside. The first window WIN1 may be exposed to the outside, and the second window WIN2 may be accommodated in the case CS and may not be exposed to the outside.

Areas of the first window WIN1 and the second window WIN2 may vary depending on the rotation of the third driving unit DU3. In one exemplary embodiment, for example, when the third driving unit DU3 rotates in the clockwise direction, the first window WIN1 may decrease, and the second window WIN2 may increase. In such an embodiment, when the third driving unit DU3 rotates in the counter-clockwise direction, the first window WIN1 may increase, and the second window WIN2 may decrease.

Each of the display panel DP and the window WIN may have a same length in the second direction DR2 or a same width as the first distance DT1 between the first guide member GM1 and the second guide member GM2 in the second direction DR2.

Figure 18:
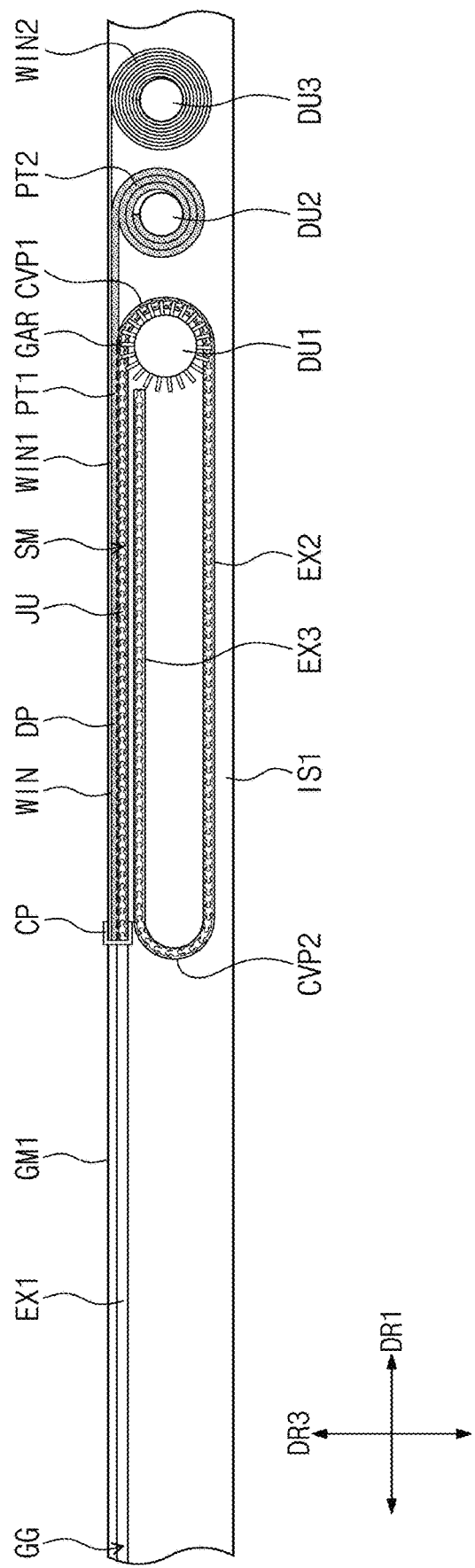
FIG. 18 is a cross-sectional view showing the display module disposed on the support member shown in FIG. 15.
Figure 19:
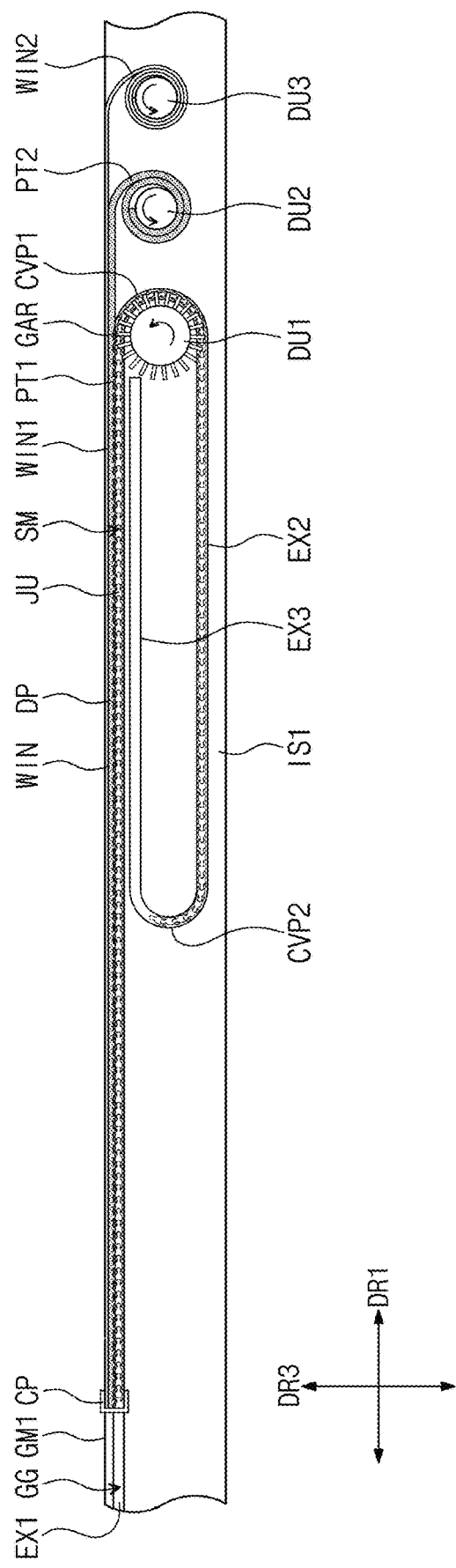
FIG. 19 is a view showing the support member and the display module, which move according to a rotation of first, second, and third driving units shown in FIG. 18.

FIG. 18 is a cross-sectional view showing the display module DM disposed on the support member SM shown in FIG. 15. FIG. 19 is a view showing the support member SM and the display module DM, which move according to the rotation of the first, second, and third driving units DU1, DU2, and DU3 shown in FIG. 18.

For convenience of illustration and description, the cross section of the inner side surface IS1 of the first guide member GM1 is shown in FIG. 18, and a cross section of the inner side surface IS2 of the second guide member GM2 may be substantially the same as the cross section of the inner side surface IS1 of the first guide member GM1.

Referring to FIG. 18, the both sides of the joint units JU may be disposed on the predetermined portion of the first extension portion EX1 adjacent to the first driving unit DU1, the second extension portion EX2, the third extension portion EX3 and the first and second curved portions CVP1 and CVP2. In one exemplary embodiment, for example, the predetermined portion of the first extension portion EX1 may overlap the second extension portion EX2. The coupling portion CP may connect the other end of the display panel DP, which is opposite to the one end of the display panel DP, the other end of the window WIN, which is opposite to the one end of the window WIN, and the end of the support member SM, which overlaps the other end of the display panel DP, to each other. Accordingly, the coupling portion CP may fix the other end of the display panel DP, the other end of the window WIN, and the end of the support member SM overlapping the other end of the display panel DP to each other. The support member SM may be disposed under the display panel DP.

The display panel DP and the window WIN, which are connected to the second and third driving units DU2 and DU3, respectively, may be disposed or extend toward the third guide member GM3. The first portion PT1 of the display panel DP and the first window WIN1 of the window WIN may be disposed toward the third guide member GM3.

The support member SM may be disposed under the first portion PT1 of the display panel DP, which is unrolled, may be in contact with a lower portion of the first portion PT1, and may support the first portion PT1. The support member SM may be separated or spaced apart from the second portion PT2. The support member SM may support the first portion PT1 that corresponds to a portion of the display panel DP.

In an exemplary embodiment, as described above with reference to FIG. 15, the insertion portions INP of the joint units JU may be inserted into the guide grooves GG In an exemplary embodiment, as described above with reference to FIG. 16, the protrusions of the gear unit GAR of the first driving unit DU1 may be inserted into the openings OP of the joint units JU disposed in the first curved portion CVP1.

Referring to FIG. 19, the first, second, and third driving units DU1, DU2, and DU3 may rotate in the counter-clockwise direction. In an exemplary embodiment as described in FIG. 16, the protrusions of the gear unit GAR may rotate after being inserted into the openings OP of the joint units JU disposed in the first curved portion CVP1, and thus the joint units JU may move.

The support member SM, the display panel DP, and the window WIN may be connected to the coupling portion CP, and the joint units JU may move toward the third guide member GM3 along the first extension portion EX1 according to the rotation of the first driving unit DU1. Accordingly, the display panel DP and the window WIN may move while being unrolled to allow the exposed area of the display panel DP and the window WIN to be expanded. The display panel DP and the window WIN may move along the first guide member GM1 and the second guide member GM2 toward the third guide member GM3.

In such an embodiment, when the first, second, and third driving units DU1, DU2, and DU3 rotate in the clockwise direction, the joint units JU may move to be disposed in the guide grooves GG as shown in FIG. 18. Accordingly, the display panel DP and the window WIN may be rolled on the second and third driving units DU2 and DU3, respectively, and the exposed area of the display panel DP and the window WIN may be reduced. The display panel DP and the window WIN may move along the first guide member GM1 and the second guide member GM2 to be farther away from the third guide member GM3.

Since the both sides of the joint units JU are inserted into the guide grooves GG and supported by the first and second guide members GM1 and GM2, the joint units JU may support the display panel DP, which is unrolled to enlarge the exposed area, to be substantially flat.

In a case where at least two driving units among the first, second, and third driving units DU1, DU2, and DU3 are arranged in the third direction DR3, the thickness of the guide member GM may increase to dispose the driving units. In an exemplary embodiment, since the first, second, and third driving units DU1, DU2, and DU3 are arranged in the first direction DR1, the thickness of the guide member GM may decrease.

In an exemplary embodiment, as described above, the openings OP may be defined in some joint units JU among the joint units JU. In one exemplary embodiment, for example, as described with reference to FIG. 2, the portion of the display module DM may be exposed to the outside through the portion corresponding to ⅓ of the image opening portion TOP in the normal mode. In such an embodiment, the joint units JU disposed in the portion corresponding to ⅓ of the image opening portion TOP may not include the openings OP, and other joint units JU may include the openings OP.

In an exemplary embodiment, the first portion PT1 may be the portion corresponding to ⅓ of the display panel DP in the normal mode and may be exposed to the outside at default. Therefore, the first portion PT1 may not be further reduced from the portion corresponding to ⅓ of the display panel DP and may be expanded as shown in FIGS. 3 and 4. In such an embodiment, the joint units JU disposed in the portion corresponding to ⅓ of the image opening portion TOP in the normal mode may not move to the gear unit GAR, and thus the joint units JU disposed in the portion corresponding to ⅓ of the image opening portion TOP in the normal mode may not include the openings OP.

Figure 20:
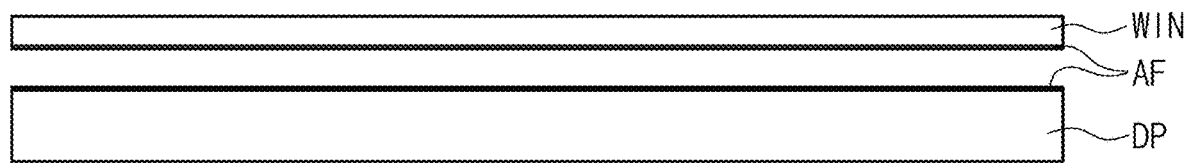
FIG. 20 is a view showing a functional layer disposed on an upper surface of the display panel and a lower surface of a window shown in FIG. 18.
Figure 21:
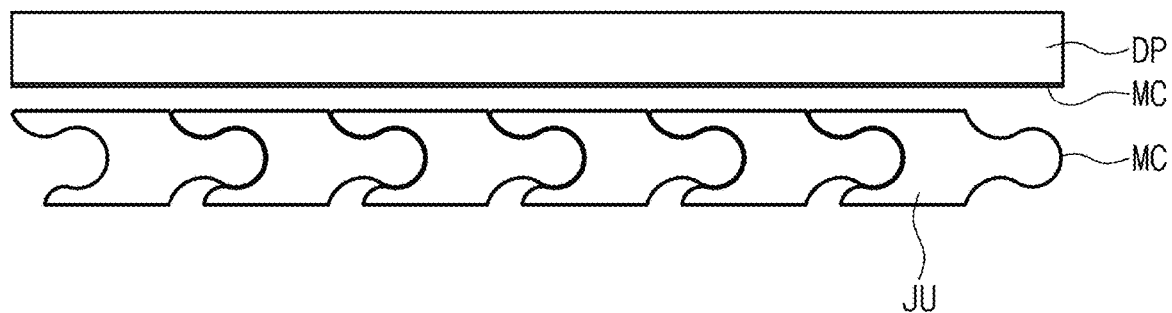
FIG. 21 is a view showing a magnetic layer disposed on a lower surface of the display panel and a surface of each of joint units shown in FIG. 18.

FIG. 20 is a view showing a functional layer AF disposed on an upper surface of the display panel DP and a lower surface of the window WIN shown in FIG. 18. FIG. 21 is a view showing a magnetic layer MC disposed on a lower surface of the display panel DP and a surface of each of the joint units JU shown in FIG. 18.

FIG. 20 shows a predetermined portion of the unrolled portion of the display panel DP and a predetermined portion of the unrolled window WIN. For convenience of illustration, the window WIN is shown as being spaced apart from the display panel DP, however, the unrolled window WIN and the unrolled portion of the display panel DP may contact each other as shown in FIG. 18.

FIG. 21 shows the predetermined portion of the unrolled portion of the display panel DP and some joint units among the joint units JU. For convenience of illustration, the joint units JU are shown as being spaced apart from the display panel DP, however, the joint units JU may contact the lower portion of the unrolled portion of the display panel DP to support the display panel DP as shown in FIG. 18.

Referring to FIG. 20, the functional layer AF may be disposed on the upper surface of the display panel DP and the lower surface of the window WIN facing the upper surface of the display panel DP. The functional layer AF may be defined as an anti-fingerprint functional layer.

The functional layer AF may contain fluorine. The functional layer AF may provide a smooth surface on the upper surface of the display panel DP and the lower surface of the window WIN. The functional layer AF may have a thickness of a few tens of angstroms (Å) in the third direction DR3.

In a case where the functional layer AF is not provided on the upper surface of the display panel DP and the lower surface of the window WIN, particles may be adsorbed on the upper surface of the display panel DP and the lower surface of the window WIN. The upper surface of the display panel DP and the lower surface of the window WIN may be damaged due to the particles adsorbed on the upper surface of the display panel DP and the lower surface of the window WIN.

However, according to an exemplary embodiment of the disclosure, the particles may be effectively prevented from being adsorbed on the upper surface of the display panel DP and the lower surface of the window WIN by the functional layer disposed on the upper surface of the display panel DP and the lower surface of the window WIN. Thus, the upper surface of the display panel DP and the lower surface of the window WIN may be prevented from being damaged due to the particles.

Referring to FIG. 21, in an exemplary embodiment, a magnetic material MC may be coated on the lower surface of the display panel DP. In such an embodiment, the magnetic material MC may be coated on the surface of each of the joint units JU. A layer, on which the magnetic material MC is coated, may be referred to as the magnetic layer MC. The magnetic layer MC may include a rare earth element, such as ferrite or neodymium.

The display panel DP may contact (or be attached to) the joint units JU by an attractive force generated by the magnetic layer MC disposed on the lower surface of the display panel DP and the surface of the joint units JU. Accordingly, the display panel DP may be effectively supported by the joint units JU.

In an exemplary embodiment, as described above, the joint units JU may include a metal material. In such an embodiment, the magnetic layer MC provided on the joint units JU may be omitted. In such an embodiment, where the magnetic layer MC provided on the joint units JU is omitted, the joint units JU that includes the metal material may be allowed to contact the display panel DP due to the magnetic layer MC disposed on the lower surface of the display panel DP.

FIGS. 22 to 31 are views showing guide grooves and joint units of a display device and various locations of a third driving unit according to various exemplary embodiment of the disclosure.

For convenience of illustration and description, FIGS. 22, 23, 27, 28, and 29 show an inner side surface corresponding to that shown in FIG. 12. The configuration of the display device according to exemplary embodiments of the disclosure shown in FIGS. 22, 23, 27, 28, and 29 is substantially the same as the configuration of the display device DD described with reference to FIGS. 1 to 20 except for a configuration of guide grooves GG_1 and GG_2, a configuration of joint units JU_1 and JU_2, and an arrangement position of the third driving unit DU3.

Accordingly, the configuration of guide grooves GG_1 and GG_2, the configuration of joint units JU_1 and JU_2, and the arrangement position of the third driving unit DU3 will be mainly described with reference to FIGS. 22 to 31, and the same configurations shown in FIGS. 22, 23, 27, 28, and 29 as those of the exemplary embodiments of the display device DD described with reference to FIGS. 1 to 20 have been labeled with the same reference numerals as used above.

Figure 22:
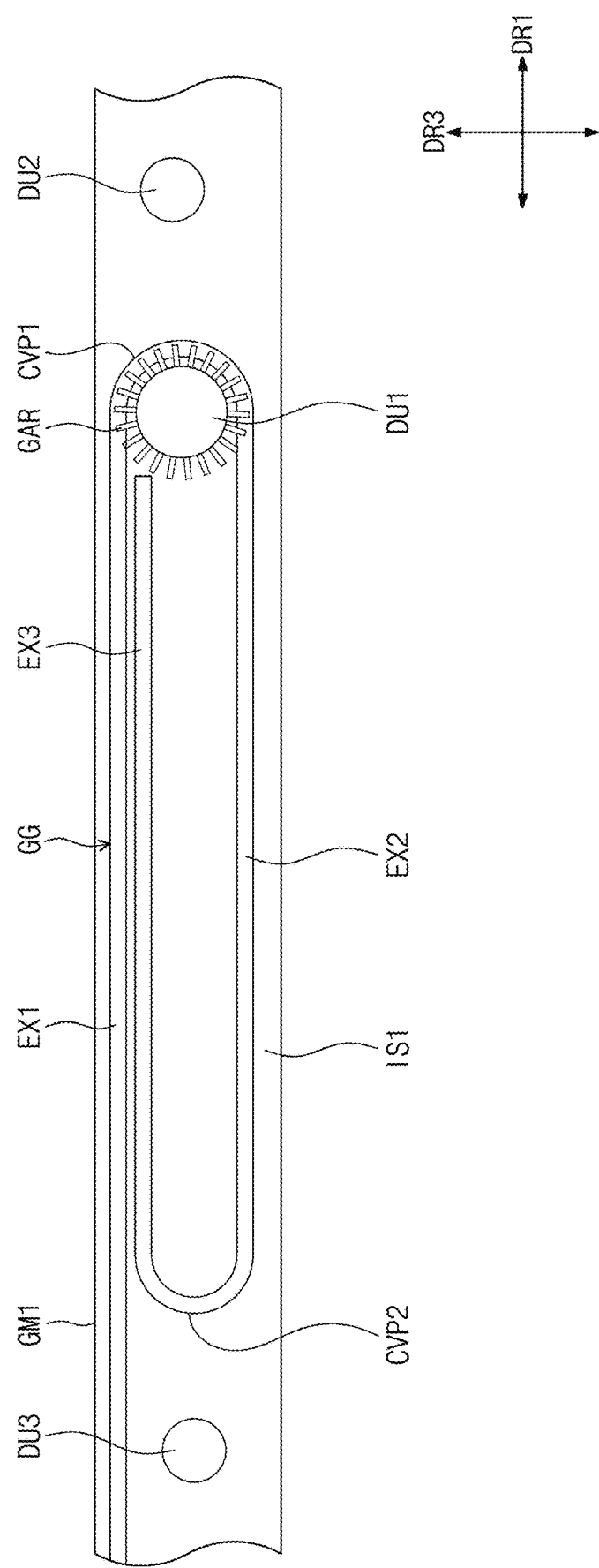
FIGS. 22 to 31 are views showing guide grooves and joint units of a display device and various locations of a third driving unit according to various exemplary embodiments of the disclosure.

FIG. 22 shows the arrangement of the third driving unit DU3 of the display device according to an alternative exemplary embodiment of the disclosure.

Referring to FIG. 22, the third driving unit DU3 may be disposed adjacent to the second curved portion CVP2. The third driving unit DU3 disposed adjacent to the second driving unit DU2 in FIG. 12 may move to a position adjacent to the second curved portion CVP2 as shown in FIG. 22. Accordingly, the first and second curved portions CVP1 and CVP2 and the first driving unit DU1 may be disposed between the second driving unit DU2 and the third driving unit DU3.

Although not shown in figures, the window WIN connected to and rolled on the third driving unit DU3 may pass under the second extension portion EX2 of the guide groove GG and may pass through a right side of the second driving unit DU2 to be disposed on the display panel DP.

Figure 23:
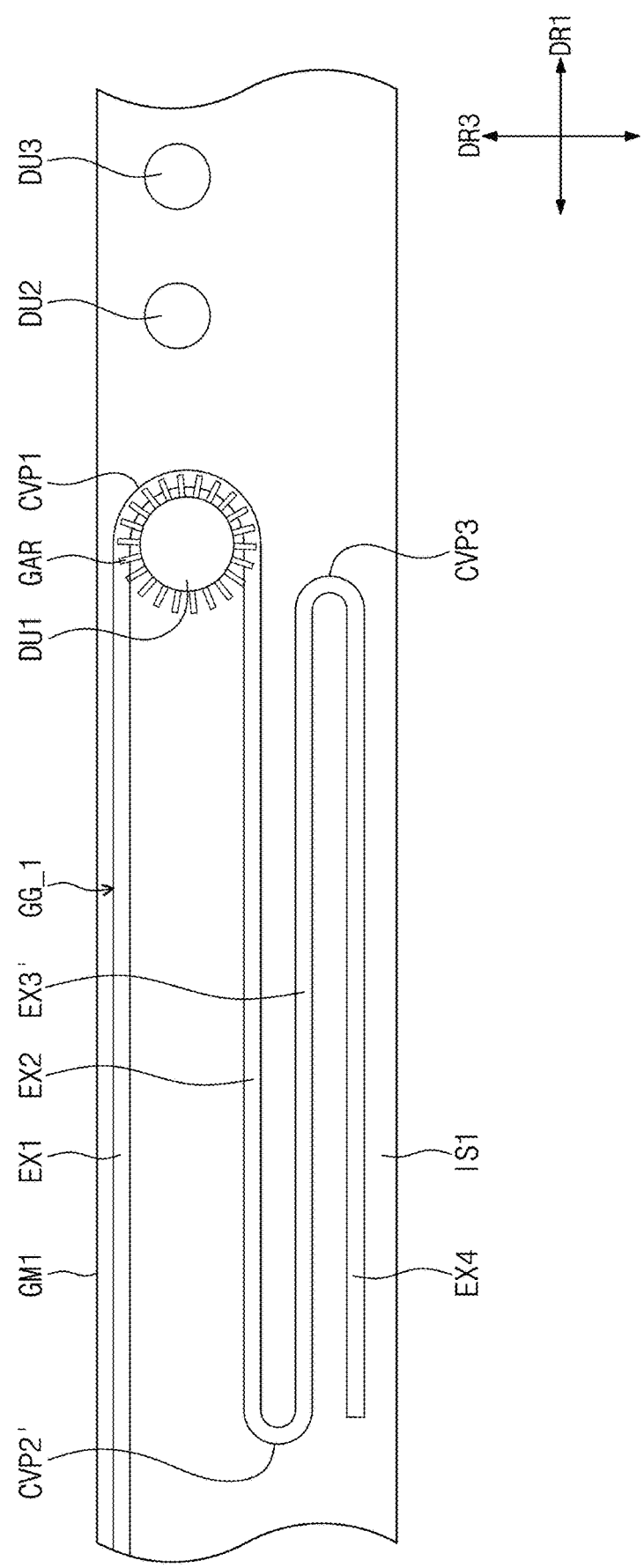
Figure 24:
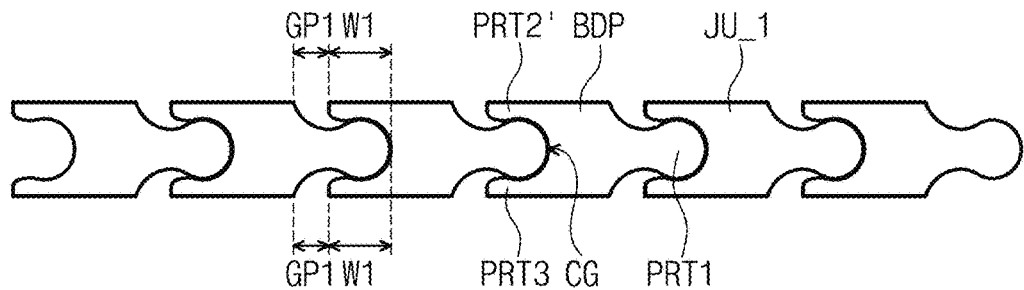
Figure 25:
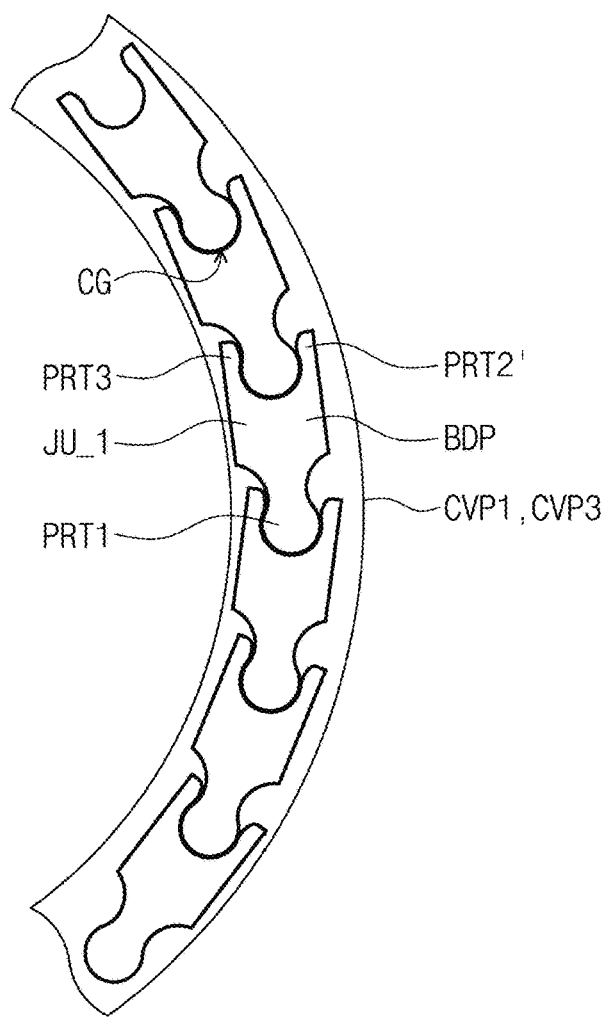
Figure 26:
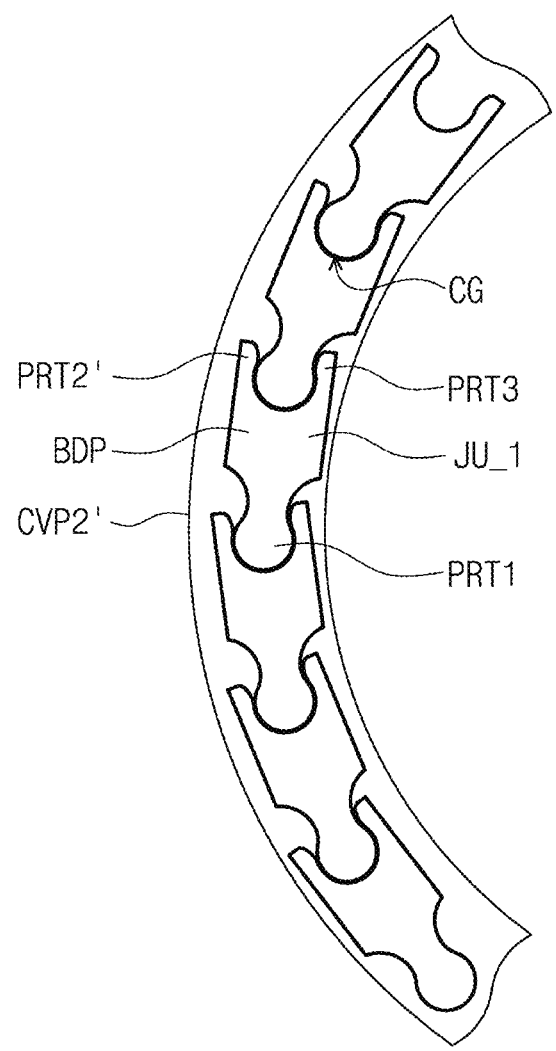

FIG. 23 shows the configuration of the guide groove of the display device according to another alternative exemplary embodiment of the disclosure. FIGS. 24 to 26 show the joint units disposed in the guide groove shown in FIG. 23.

For the convenience of explanation, FIGS. 24 to 26 show side surfaces of the joint units JU_1 and do not show openings OP.

Referring to FIG. 23, the guide groove GG_1 may include a first extension portion EX1, a second extension portion EX2, a third extension portion EX3', a fourth extension portion EX4, a first curved portion CVP1, a second curved portion CVP2', and a third curved portion CVP3. The first extension portion EX1, the second extension portion EX2, and the first curved portion CVP1 may be substantially the same as the first extension portion EX1, the second extension portion EX2, and the first curved portion CVP1 shown in FIG. 12.

The third extension portion EX3' may extend in the first direction DR1, may have a length smaller than that of the first extension portion EX1, and may be disposed under the second extension portion EX2. The second curved portion CVP2' may extend from the other end of the second extension portion EX2, which is opposite to one end of the second extension portion EX2, to the other end of the third extension portion EX3', which is opposite to one end of the third extension portion EX3', in a curved shape.

A direction in which the second curved portion CVP2' is curved may be opposite to a direction in which the first curved portion CVP1 is curved. The other end of the third extension portion EX3' may be disposed adjacent to the other end of the second extension portion EX2. The one end of the third extension portion EX3' may be disposed closer to the first driving unit DU1 than to the other end of the third extension portion EX3' is.

The fourth extension portion EX4 may extend in the first direction DR1, may have a length smaller than that of the first extension portion EX1, and may be disposed under the third extension portion EX3'. The third curved portion CVP3 may extend from the one end of the third extension portion EX3' to the one end of the fourth extension portion EX4 adjacent to the one end of the third extension portion EX3' in the curved shape.

A direction in which the third curved portion CVP3 is curved may be substantially the same as a direction in which the first curved portion CVP1 is curved. The one end of the fourth extension portion EX4 may be disposed closer to the first driving unit DU1 than to the other end of the fourth extension portion EX4, which is opposite to the one end of the fourth extension portion EX4, is.

Referring to FIG. 24, each of the joint units JU_1 may include first, second, and third protrusion portions PRT1, PRT2', and PRT3 and a body portion BDP. The first and third protrusion portions PRT1 and PRT3 and the body portion BDP may be substantially the same as the first and third protrusion portions PRT1 and PRT3 and the body portion BDP of the joint unit JU.

The second protrusion portion PRT2' may have a shape symmetrical with the third protrusion portion PRT3. Accordingly, a distance between an end of the second protrusion portion PRT2' of an (h+1)-th joint unit JU_1 and an upper end of the body portion BDP of an h-th joint unit JU_1 may be a first gap GP1. In addition, the second protrusion portion PRT2' and the third protrusion portion PRT3 may have the same first width W1 in the first direction DR1.

Referring to FIG. 25, when both sides of the joint units JU_1 are disposed in the first curved portion CVP1 and the third curved portion CVP3, a distance between lower ends of the joint units JU_1 adjacent to each other becomes narrower than the first gap GP1, and a distance between upper ends of the joint units JU_1 adjacent to each other becomes wider than the first gap GP1. Therefore, the joint units JU_1 may be arranged along each of the first curved portion CVP1 and the third curved portion CVP3 to have a curved form.

Referring to FIG. 26, when the both sides of the joint units JU_1 are disposed in the second curved portion CVP2', a distance between upper ends of the joint units JU_1 adjacent to each other becomes narrower than the first gap GP1, and a distance between lower ends of the joint units JU_1 adjacent to each other becomes wider than the first gap GP1. Therefore, the joint units JU_1 may be arranged along the second curved portion CVP2' to have a curved form.

In an exemplary embodiment, as described above, the configuration in which the joint units JU_1 are disposed in the guide groove GG_1 as shown in FIGS. 23 to 26, however the configuration of the joint units JU_1 should not be limited thereto or thereby. In an alternative exemplary embodiment, the joint units JU_1 may be disposed in the guide groove GG as shown in FIG. 12.

Figure 27:
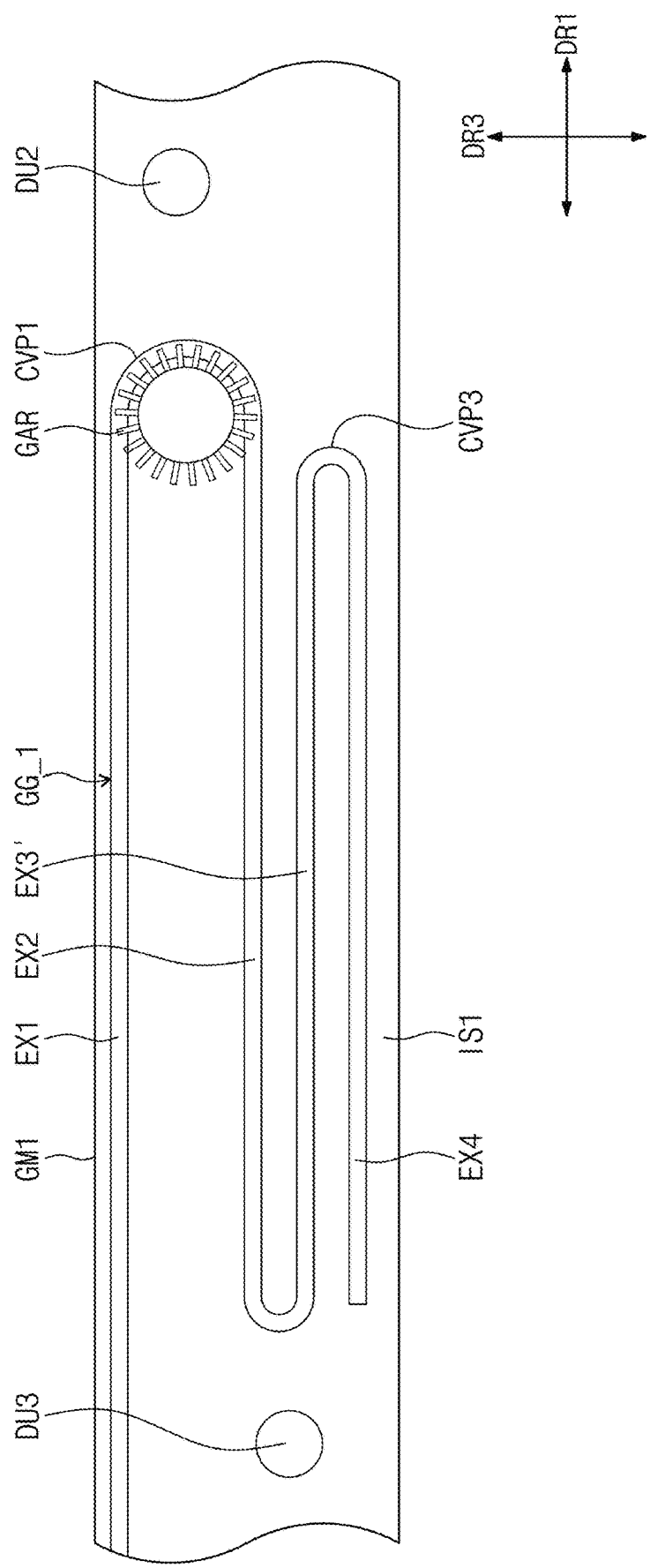

FIG. 27 shows an arrangement of a third driving unit of a display device according to another alternative exemplary embodiment of the disclosure.

Referring to FIG. 27, in such an embodiment, a guide groove GG_1 may be substantially the same as the guide groove GG_1 shown in FIG. 23. In such an embodiment, the arrangement position of the third driving unit DU3 may be substantially the same as the arrangement position of the third driving unit DU3 shown in FIG. 22.

The third driving unit DU3 may be disposed adjacent to the second curved portion CVP2'. The first, second, and third curved portions CVP1, CVP2', and CVP3 and the first driving unit DU1 may be disposed between the second driving unit DU2 and the third driving unit DU3.

Figure 28:
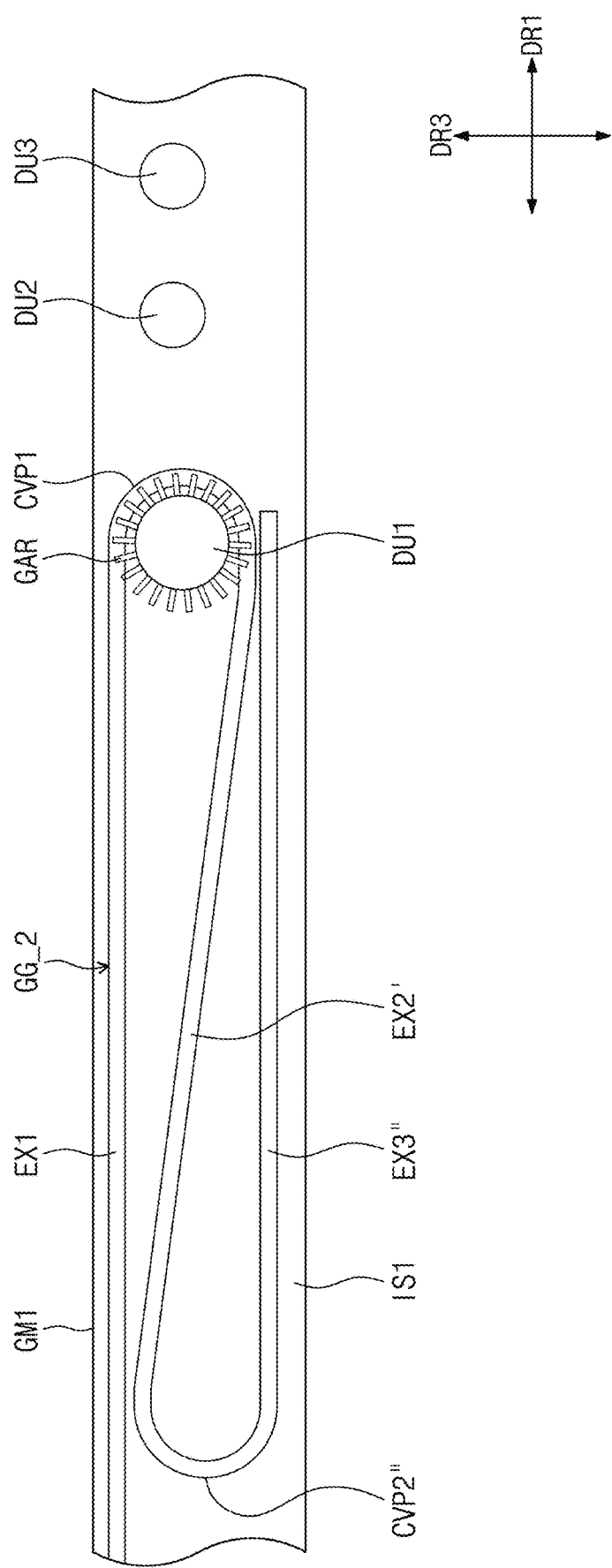

FIG. 28 shows a configuration of a guide groove of a display device according to another alternative exemplary embodiment of the disclosure.

Referring to FIG. 28, in such an embodiment, the guide groove GG_2 may include a first extension portion EX1, a second extension portion EX2', a third extension portion EX3", a first curved portion CVP1, and a second curved portion CVP2". The first extension portion EX1 and the first curved portion CVP1 may be substantially the same as the first extension portion EX1 and the first curved portion CVP1 shown in FIG. 12.

The second extension portion EX2' may have a length smaller than the first extension portion EX1 and may extend to form an angle smaller than about 90 degrees with respect to the first direction DR1. The third extension portion EX3" may extend in the first direction DR1, may have a length smaller than the first extension portion EX1, and may be disposed under the second extension portion EX2'.

The second curved portion CVP2" may extend from the other end of the second extension portion EX2, which is opposite to one end of the second extension portion EX2, to the other end of the third extension portion EX3", which is opposite to one end of the third extension portion EX3", in a curved shape. A direction in which the second curved portion CVP2" is curved may be opposite to a direction in which the first curved portion CVP1 is curved.

Although not shown in figures, the joint units disposed in the first curved portion CVP1 and the second curved portion CVP2" may be the joint units JU_1 shown in FIG. 24. The joint units JU_1 disposed in the first curved portion CVP1 may be arranged in the same way as the joint units JU_1 shown in FIG. 25. The joint units JU_1 disposed in the second curved portion CVP2" may be arranged in the same way as the joint units JU_1 shown in FIG. 26.

Figure 29:
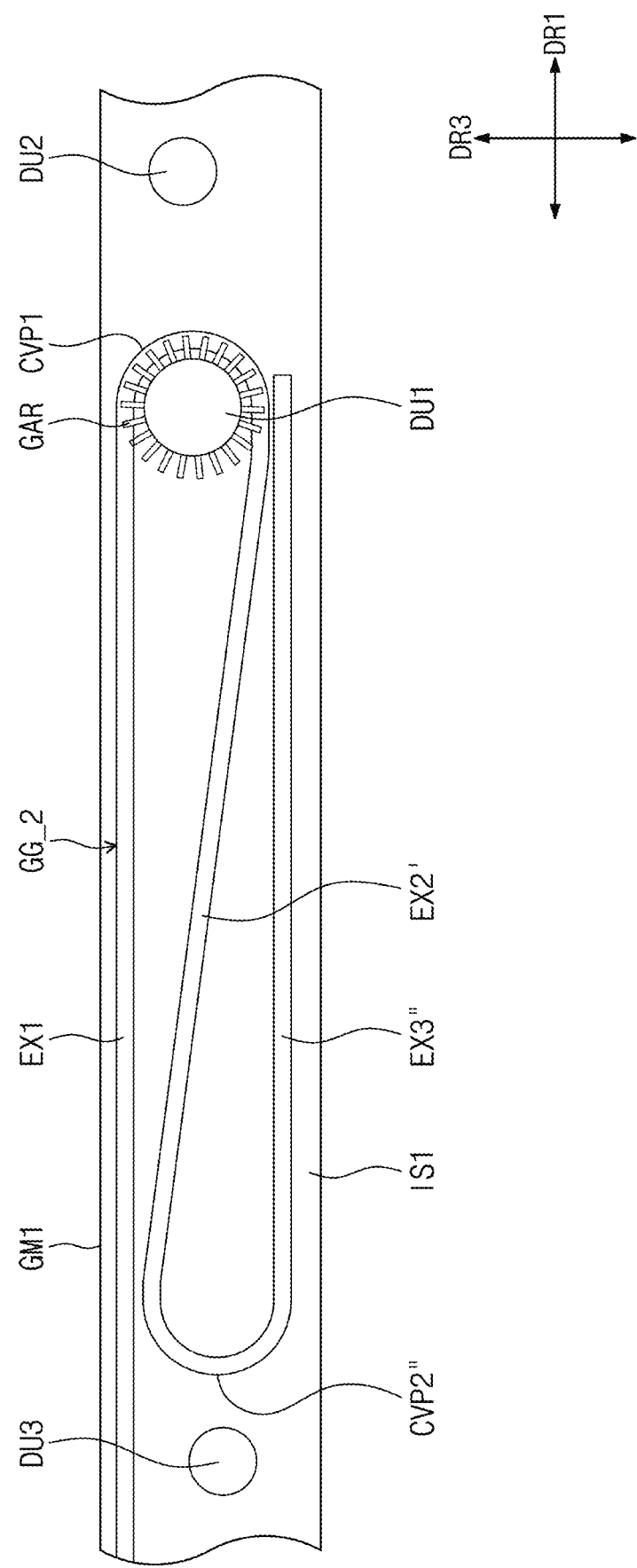

FIG. 29 shows an arrangement of a third driving unit of a display device according to another alternative exemplary embodiment of the disclosure.

Referring to FIG. 29, in such an embodiment, a guide groove GG_2 may be substantially the same as the guide groove GG_2 shown in FIG. 28. In such an embodiment, the arrangement position of the third driving unit DU3 may be substantially the same as the arrangement position of the third driving unit DU3 shown in FIG. 22.

The third driving unit DU3 may be disposed adjacent to the second curved portion CVP2". The first and second curved portions CVP1 and CVP2" and the first driving unit DU1 may be disposed between the second driving unit DU2 and the third driving unit DU3.

Figure 30:
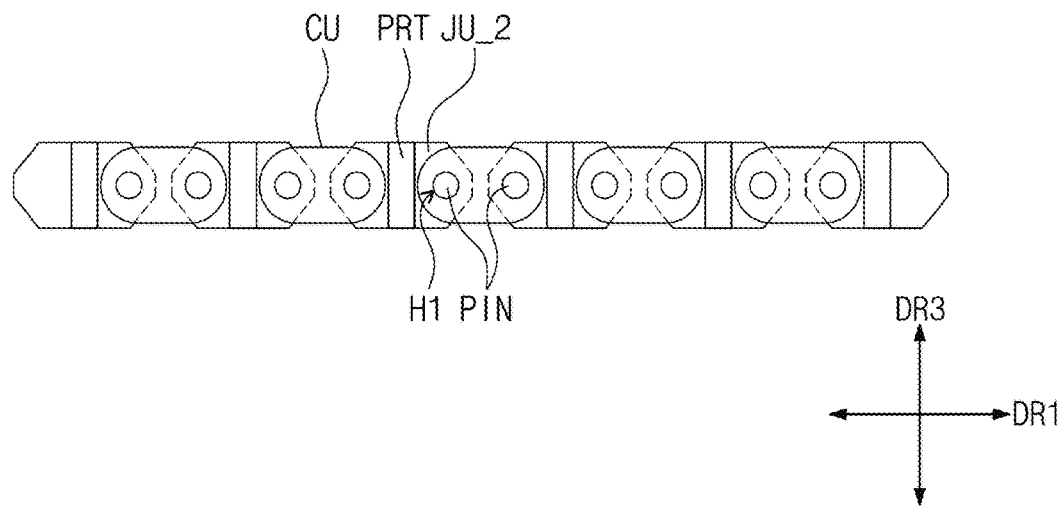
Figure 31:
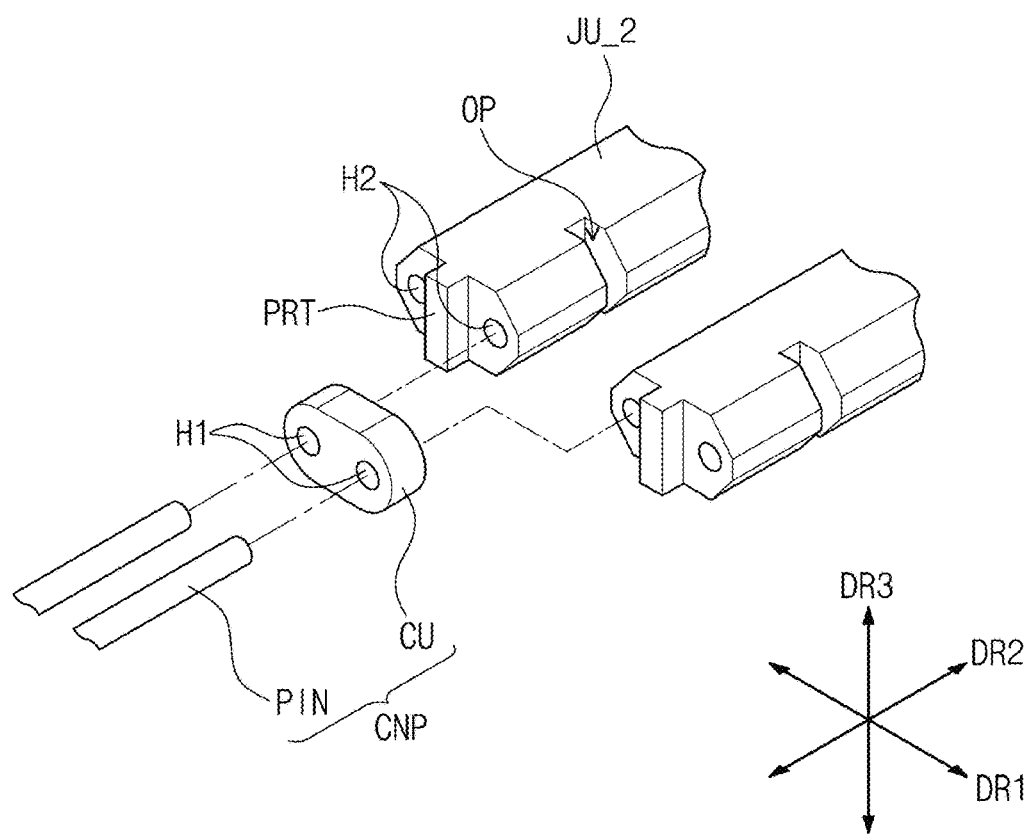

FIGS. 30 and 31 show joint units JU_2 of a display device according to another alternative exemplary embodiment of the disclosure.

Referring to FIGS. 30 and 31, the joint units JU_2 may extend in the second direction DR2 and may be arranged in the first direction DR1. Similar to the joint units JU of the exemplary embodiments described above, openings OP may be defined in the joint units JU_2.

A plurality of connection portions CNP may be disposed on both sides of the joint units JU_2 opposite to each other with respect to the second direction DR2. The joint units JU_2 may be connected to rotate with respect to each other by the connection portions CNP. In such an embodiment, as shown in FIGS. 30 and 31, the connection portions CNP may include a plurality of connection units CU and a plurality of pin units PIN. Each of the connection units CU may include a plurality of first holes H1 defined therein and spaced apart from each other in the first direction DR1.

Each of the joint units JU_2 may include a protrusion portion PRT protruded from each of both sides of each of the joint units JU_2 in the second direction DR2. The protrusion portion PRT may be disposed at a center portion of each of the both sides of each of the joint units JU_2. Alternatively, the protrusion portion PRT may be omitted.

FIGS. 30 and 31 show only one side surface of each of the joint units JU_2 for convenience of illustration. In such an embodiment, the other side surface of each of the joint units JU_2, which is opposite to one side surface of each of the joint units JU_2, may have the same structure as that of the one side surface of each of the joint units JU_2.

A plurality of second holes H2 may be defined in each of the side surfaces of each of the joint units JU_2. The second holes H2 may be spaced apart from each other in the first direction DR1 and may extend in the second direction DR2. The second holes H2 may be disposed one at each side with the protrusion portion PRT therebetween.

The connection units CU may be disposed on the both side surfaces of the joint units JU_2 in a way such that the first holes H1 overlap with the second holes H2. One connection unit CU may be disposed on the side surfaces of two joint units JU_2 adjacent to each other. The pin units PIN may be inserted into the first and second holes H1 and H2 to allow the joint units JU_2 to be connected and to rotate with respect to each other.

Although some exemplary embodiments of the invention have been described, it is understood that the invention should not be limited to these exemplary embodiments, but various changes and modifications can be made by one ordinary skilled in the art within the spirit and scope of the invention as hereinafter claimed. Therefore, the disclosed subject matter should not be limited to any single embodiment described herein, and the scope of the invention shall be determined according to the attached claims.

What is claimed is:

1. A display device comprising:
a first guide member extending in a first direction;
a second guide member extending in the first direction and facing the first guide member in a second direction crossing the first direction;
a display panel disposed between the first guide member and the second guide member, the display panel defined by an upper major surface plane and a lower major surface plane and a length of both the upper and lower major surface planes extend from a first end to an opposite second end;
a support member which supports an unrolled portion of the display panel and is separated from a rolled portion of the display panel;
a first driving unit which moves the support member; and
a second driving unit connected to one end of the display panel to roll or unroll the display panel,
wherein
both sides of the support member are inserted into guide grooves defined in an inner side surface of the first guide member and an inner side surface of the second guide member, which faces the inner side surface of the first guide member,
the support member moves along the guide grooves, and
the first driving unit and the second driving unit are both located under the lower major surface plane and at the second end of the display panel in a top plan view.

2. The display device of claim 1, wherein the first and second driving units are arranged in the first direction, extend in the second direction, and connected to the first and second guide members.

3. The display device of claim 1, wherein the first and second driving units rotate in a same direction with respect to a rotation axis substantially parallel to the second direction.

4. The display device of claim 1, further comprising:
a third guide member extending in the second direction and connected to one end of the first guide member and one end of the second guide member; and
a fourth guide member extending in the second direction and connected to the other end of the first guide member and the other end of the second guide member,
wherein the second driving unit is disposed closer to the fourth guide member than the first driving unit is,
the display panel connected to the second driving unit extends toward the third guide member, and
the guide groove extends from an area adjacent to the first driving unit to the third guide member.

5. The display device of claim 4, wherein the display panel comprises:
a first portion which moves along the first and second guide members and is exposed to an outside; and
a second portion extending from the first portion, not exposed to the outside, and rolled on the second driving unit,
wherein the support member is disposed under the first portion to support the first portion and separated from the second portion.

6. The display device of claim 5, further comprising:
a window disposed on the first portion, wherein the window contacts the first portion of the display panel and is spaced apart from the second portion of the display panel; and a third driving unit connected to one end of the window spaced apart from the second portion to roll a portion of the window, which is spaced apart from the second portion, wherein the first, second and third driving units are arranged in the first direction, extend in the second direction, and rotate in a same direction as each other with respect to a rotation axis substantially parallel to the second direction, and the third driving unit is disposed closer to the fourth guide member than the second driving unit is.

7. The display device of claim 6, further comprising:
a coupling portion which fixes the other end of the display panel, the other end of the window, and an end of the support member overlapping the other end of the display panel to each other and moves along the first and second guide members.

8. The display device of claim 6, further comprising:
a functional layer disposed on each of an upper surface of the display panel and a lower surface of the window, which faces the upper surface of the display panel.

9. The display device of claim 8, wherein the functional layer comprises a fluorine.

10. The display device of claim 1, wherein the guide groove comprises:
a first extension portion extending in the first direction;
a second extension portion disposed under the first extension portion, extending in the first direction, and having a length smaller than a length of the first extension portion;
a third extension portion extending in the first direction, having a length smaller than the length of the first extension portion, and disposed between the first extension portion and the second extension portion;
a first curved portion extending from one end of the first extension portion to one end of the second extension portion in a curved shape; and
a second curved portion extending from the other end of the second extension portion to the other end of the third extension portion, which is opposite to one end of the third extension portion, in a curved shape,
the one end of each of the first, second, and third extension portions is disposed adjacent to the first driving unit,
a direction in which the first curved portion is curved is opposite to a direction in which the second curved portion is curved, and
the first driving unit is disposed adjacent to the first curved portion.

11. The display device of claim 10, wherein the support member comprises a plurality of joint units which extends in the second direction, is arranged in the first direction, and is coupled to each other to rotate.

12. The display device of claim 11, further comprising:
a magnetic layer disposed on a lower surface of the display panel and a surface of the joint units.

13. The display device of claim 12, wherein the magnetic layer comprises a ferrite or a rare earth element.

14. The display device of claim 11, wherein the first driving unit comprises:
a rotation axis unit extending in the second direction; and
a gear unit disposed on an outer circumferential surface of a predetermined portion of the rotation axis unit,
wherein an opening is defined in each of a predetermined number of joint units among the joint units, and a protrusion of the gear unit is inserted into the opening defined in a joint unit of the predetermined number of joint units, which is in the first curved portion.

15. The display device of claim 14, wherein a width of the protrusion of the gear unit, which is defined in the first direction, is smaller than a width of the opening defined in the first direction.

16. The display device of claim 14, wherein each of the joint units comprises:
a body portion extending in the second direction;
a first protrusion portion protruded from one end of the body portion to the first direction;
a second protrusion portion protruded from an upper end of the other end of the body portion to the first direction;
a third protrusion portion protruded from a lower end of the other end of the body portion to the first direction; and
a groove portion defined between the second protrusion portion and the third protrusion portion,
wherein the first protrusion portion of an h-th joint unit is inserted into the groove portion of an (h+1)-th joint unit, wherein h is a natural number, and
the opening is defined in each of the predetermined number of joint units as extending from a predetermined portion of the body portion thereof to an end of the first protrusion portion thereof in the first direction.

17. The display device of claim 16, wherein a width of the second protrusion portion in the first direction is greater than a width of the third protrusion portion in the first direction.

18. The display device of claim 16, wherein a first distance between an end of the third protrusion portion of the (h+1)-th joint unit and a lower end of the body portion of the h-th joint unit is larger than a second distance between an end of the second protrusion portion of the (h+1)-th joint unit and an upper end of the body portion of the h-th joint unit.

19. The display device of claim 16, wherein the first protrusion portion comprises:
a concave portion extending in the first direction from the one end of the body portion and comprising upper and lower surfaces which are concaved when viewed in a plan view in the second direction; and
a convex portion extending in the first direction from the concave portion and having an oval-like shape when viewed in the plan view in the second direction,
wherein the groove portion has a shape corresponding to the concave portion and the convex portion.

20. The display device of claim 16, wherein
the second protrusion portion has a same width as a width of the third protrusion portion, and
the second protrusion portion has a symmetrical shape with.

21. The display device of claim 11, further comprising:
a plurality of connection units disposed on both side surfaces of the joint units opposite to each other with respect to the second direction to connect the joint units to rotate.

22. The display device of claim 10, further comprising:
a window in contact with a portion of the display panel and spaced part from another portion of the display panel; and
a third driving unit connected to one end of the window spaced apart from the display panel to roll the portion of the window, which is spaced apart from the display panel, thereon, wherein the third driving unit is disposed adjacent to the second curved portion, and the first and second curved portions and the first driving unit are disposed between the second driving unit and the third driving unit.

23. The display device of claim 1, wherein the guide groove further comprises:
a first extension portion extending in the first direction;
a second extension portion disposed under the first extension portion, extending in the first direction, and having a length smaller than a length of the first extension portion;
a third extension portion extending in the first direction, having a length smaller than the length of the first extension portion, and disposed under the second extension portion;
a fourth extension portion extending in the first direction, having a length smaller than the length of the first extension portion, and disposed under the third extension portion;
a first curved portion extending from one end of the first extension portion to one end of the second extension portion in a curved shape;
a second curved portion extending from the other end of the second extension portion to the other end of the third extension portion, which is opposite to one end of the third extension portion, in a curved shape; and
a third curved portion extending from the one end of the third extension portion to one end of the fourth extension portion, which is adjacent to the one end of the third extension portion, in a curved shape,
the one end of each of the first, second, and third extension portions is disposed adjacent to the first driving unit,
a direction in which the first curved portion is curved is opposite to a direction in which the second curved portion is curved,
a direction in which the third curved portion is curved is the same as the direction in which the first curved portion is curved, and
the first driving unit is disposed adjacent to the first curved portion.

24. The display device of claim 1, wherein the guide groove comprises:
a first extension portion extending in the first direction;
a second extension portion disposed under the first extension portion, extending in a direction that forms an angle smaller than about 90 degrees with respect to the first direction, and having a length smaller than a length of the first extension portion;
a third extension portion disposed under the second extension portion, extending in the first direction, having a length smaller than the length of the first extension portion;
a first curved portion extending from one end of the first extension portion to one end of the second extension portion in a curved shape; and
a second curved portion extending from the other end of the second extension portion to the other end of the third extension portion, which is opposite to one end of the third extension portion, in a curved shape,
the one end of each of the first, second, and third extension portions is disposed adjacent to the first driving unit,
a direction in which the first curved portion is curved is opposite to a direction in which the second curved portion is curved, and the first driving unit is disposed adjacent to the first curved portion.

25. A display device comprising:
a display panel;
a support member disposed under the display panel;
a first driving unit coupled to a predetermined portion of the support member to move the support member;
a second driving unit connected to one end of the display panel to roll or unroll the display panel;
a window disposed on an unrolled portion of the display panel and spaced apart from a rolled portion of display panel; and
a third driving unit connected to one end of the window spaced apart from the display panel to roll a portion of the window, which is spaced apart from the display panel,
wherein the support member supports a flat and an unrolled portion of the display panel and does not overlap a rolled portion of the display panel in a thickness direction of the unrolled portion of the display panel, the thickness direction is defined by a distance between major upper and lower surface planes defining the flat and unrolled portion of the display panel in a top plan view,
the second driving unit is disposed between the first driving unit and the third driving unit, and
the first, second, and third driving units rotate in a same direction as each other.

26. The display device of claim 25, further comprising:
a first guide member extending in a first direction;
a second guide member extending in the first direction and facing the first guide member in a second direction crossing the first direction;
a third guide member extending in the second direction and connected to one end of the first guide member and one end of the second guide member; and
a fourth guide member extending in the second direction and connected to the other end of the first guide member and the other end of the second guide member,
wherein the display panel, the window, the support member, and the first, second, and third driving units are disposed between the first guide member and the second guide member,
the first, second, and third driving units are disposed adjacent to the fourth guide member,
the display panel and the window, which are respectively connected to the second and third driving units, are disposed to face the third guide member,
the first, second, and third driving units are arranged in the first direction, extend in the second direction, are connected to the first and second guide members,
the third driving unit is disposed closer to the fourth guide member than the first and second driving units are,
both sides of the support member are inserted into guide grooves defined in an inner side surface of the first guide member and an inner side surface of the second guide member, which faces the inner side surface of the first guide member, and
the support member moves along the guide grooves.

27. The display device of claim 26, wherein the guide groove comprises:
a first extension portion extending in the first direction;
a second extension portion disposed under the first extension portion, extending in the first direction, and having a length smaller than a length of the first extension portion;

a third extension portion extending in the first direction, having a length smaller than the length of the first extension portion, and disposed between the first extension portion and the second extension portion;
a first curved portion extending from one end of the first extension portion to one end of the second extension portion in a curved shape; and
a second curved portion extending from the other end of the second extension portion to the other end of the third extension portion, which is opposite to one end of the third extension portion, in a curved shape,
the one end of each of the first, second, and third extension portions is disposed adjacent to the first driving unit,
a direction in which the first curved portion is curved is opposite to a direction in which the second curved portion is curved, and
the first driving unit is disposed adjacent to the first curved portion.

28. The display device of claim 27, wherein
the support member comprises a plurality of joint units which extends in the second direction, is arranged in the first direction, and is coupled to each other to rotate,
the first driving unit comprises:
a rotation axis unit extending in the second direction; and
a gear unit disposed on an outer circumferential surface of a predetermined portion of the rotation axis unit,
wherein an opening is defined in each of a predetermined number of joint units among the joint units comprise,
a protrusion of the gear unit is inserted into the opening defined in a joint unit of the predetermined number of joint units in the first curved portion, and
a width of the protrusion of the gear unit, which is defined in the first direction, is smaller than a width of the opening defined in the first direction.

29. The display device of claim 28, wherein each of the joint units comprises:
a body portion extending in the second direction;
a first protrusion portion protruded from one end of the body portion to the first direction;
a second protrusion portion protruded from an upper end of the other end of the body portion to the first direction;
a third protrusion portion protruded from a lower end of the other end of the body portion to the first direction; and
a groove portion defined between the second protrusion portion and the third protrusion portion,
wherein the first protrusion portion of an h-th joint unit is inserted into the groove portion of an (h+1)-th joint unit, wherein h is a natural number, and
the opening of each of the predetermined number of joint units is defined as extending from a predetermined portion of the body portion thereof to an end of the first protrusion portion thereof in the first direction.

30. A display device comprising:
a first guide member;
a second guide member facing the first guide member;
a display panel disposed between the first guide member and the second guide member;
a plurality of joint units which supports a flat and an unrolled portion of the display panel and is coupled to each other to rotate, and does not overlap a rolled portion of the display panel in a thickness direction of the flat and unrolled portion of the display panel, the thickness direction is defined by a distance between major upper and lower surface planes defining the flat unrolled portion of the display panel relative to a top plan view;
a first driving unit which moves the joint units; and
a second driving unit connected to one end of the display panel to roll or unroll the display panel, both sides of the joint units are inserted into guide grooves defined in an inner side surface of the first guide member and an inner side surface of the second guide member, which faces the inner side surface of the first guide member, and the joint units move along the guide grooves.

* * * * *